United States Patent
Kim et al.

(10) Patent No.: US 12,148,784 B2
(45) Date of Patent: Nov. 19, 2024

(54) IMAGE SENSOR

(71) Applicant: Samsung Electronics Co., Ltd., Suwon-si (KR)

(72) Inventors: Dae Shik Kim, Hwaseong-si (KR); Min-Sun Keel, Seoul (KR); Hoon Joo Na, Seoul (KR); Kang Ho Lee, Seongnam-si (KR); Kil Ho Lee, Hwaseong-si (KR); Sang Kil Lee, Seongnam-si (KR); Jung Hyuk Lee, Hwaseong-si (KR); Shin Hee Han, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 612 days.

(21) Appl. No.: 17/393,855

(22) Filed: Aug. 4, 2021

(65) Prior Publication Data
US 2022/0130884 A1    Apr. 28, 2022

(30) Foreign Application Priority Data
Oct. 28, 2020   (KR) .................. 10-2020-0141089

(51) Int. Cl.
H01L 21/768    (2006.01)
H01L 27/146    (2006.01)

(52) U.S. Cl.
CPC .. H01L 27/14636 (2013.01); H01L 27/14621 (2013.01); H01L 27/14627 (2013.01); H01L 27/14629 (2013.01); H01L 27/14634 (2013.01); H01L 27/14643 (2013.01)

(58) Field of Classification Search
CPC ......... H01L 27/14636; H01L 27/14621; H01L 27/14627; H01L 27/14629; H01L 27/14634; H01L 27/14643; H01L 27/1464; H01L 27/14641; H01L 27/1469; H01L 23/522; H01L 24/05; H01L 25/0657; H01L 27/1461; H01L 27/14612; H01L 27/14632; H10N 50/10
See application file for complete search history.

(56) References Cited

U.S. PATENT DOCUMENTS

| | | | |
|---|---|---|---|
| 9,613,994 B2 | 4/2017 | Yamashita | |
| 9,780,136 B2 | 10/2017 | Kwon | |
| 10,157,951 B2 | 12/2018 | Kim et al. | |
| 10,573,679 B2 | 2/2020 | Kwon | |
| 2015/0380385 A1* | 12/2015 | Hsu | H01L 21/76802 438/459 |
| 2019/0057918 A1* | 2/2019 | Park | H01L 27/14636 |
| 2019/0103425 A1 | 4/2019 | Yoon et al. | |

(Continued)

FOREIGN PATENT DOCUMENTS

JP    2020150177 A  *  3/2019  ........... H01L 27/146

*Primary Examiner* — Samuel Park
(74) *Attorney, Agent, or Firm* — Harness, Dickey & Pierce, P.L.C.

(57) ABSTRACT

An image sensor including a variable resistance element is provided. The image sensor comprises first and second chips having first and second connecting structures; and a contact plug connecting the first and second chips. The first chip includes a photoelectric conversion element. The second chip includes a first variable resistance element. The contact plug extends from the first surface of the first semiconductor substrate to connect the first and second connecting structures.

16 Claims, 34 Drawing Sheets

(56) References Cited

U.S. PATENT DOCUMENTS

| | | |
|---|---|---|
| 2019/0103426 A1* | 4/2019 | Tanaka .................. H04N 25/70 |
| 2019/0297287 A1* | 9/2019 | Oka ....................... H04N 25/69 |
| 2019/0363130 A1 | 11/2019 | Yokoyama et al. |
| 2020/0194479 A1 | 6/2020 | Lee et al. |
| 2021/0043671 A1* | 2/2021 | Yoneda ............... H01L 27/1464 |
| 2022/0139975 A1* | 5/2022 | Kimura ............. H01L 27/14634 |
| | | 257/431 |

* cited by examiner

IMAGE SENSOR

CROSS-REFERENCE TO RELATED APPLICATION

This application claims priority to Korean Patent Application No. 10-2020-0141089, filed on Oct. 28, 2020, and all the benefits accruing therefrom under 35 U.S.C. § 119, the disclosure of which is incorporated herein by reference in its entirety.

BACKGROUND

Inventive concepts relate to an image sensor.

An image sensing device is or includes a type of semiconductor device that converts optical information into electrical signals. Examples of the image sensing device include a charge-coupled device (CCD) image sensing device and/or a complementary metal-oxide semiconductor (CMOS)-type image sensing device.

The CMOS-type image sensor may also be referred to as a CMOS image sensor (CIS). The CIS may include a plurality of pixels that are arranged two-dimensionally. Each of the pixels may include, for example, a photodiode. The photodiode converts incident light into an electrical signal.

Recently, in accordance with developments in the computer and communication industries, the demand for image sensors with improved performance has grown in various fields such as the fields of digital cameras, camcorders, smartphones, gaming devices, security cameras, medical micro cameras, and robots.

SUMMARY

Some example embodiments of inventive concepts provide an image sensor including a variable resistance element.

However, example embodiments of inventive concepts are not restricted to those set forth herein. The above and other example embodiments of inventive concepts will become more apparent to one of ordinary skill in the art to which inventive concepts pertains by referencing the detailed description of inventive concepts given below.

According to some example embodiments of inventive concepts, an image sensor comprises first and second chips, and a contact plug connecting the first and second chips. The first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, and a first connecting structure in the first insulating layer and connected to the first transistor. The second chip includes a second insulating layer including a third surface contacting the first insulating layer and a fourth surface opposite to the third surface, a second semiconductor substrate on the fourth surface of the second insulating layer, a second transistor on the second semiconductor substrate, a second connecting structure in the second insulating layer and connected to the second transistor, the second connecting structure including first and second metal layers, the second chip further including a first contact connected to the first metal layer in the second insulating layer between the first and second metal layers, and a first variable resistance element on the first contact in the second insulating layer and between the first and second metal layers, and is connected to the second metal layer. The contact plug extends from the first surface of the first semiconductor substrate to connect the first and second connecting structures.

According to some example embodiments of inventive concepts, an image sensor comprises first and second chips. The first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, a first connecting structure in the first insulating layer connected to the first transistor, and a first bonding pad connected to the first connecting structure arranged in the first insulating layer and having one surface exposed on the first insulating layer. The second chip includes a second insulating layer including a third surface contacting the first insulating layer and a fourth surface opposite to the third surface, a second semiconductor substrate on the fourth surface of the second insulating layer, a second transistor on the second semiconductor substrate, a second connecting structure in the second insulating layer and connected to the second transistor and includes first and second metal layers, a contact connected to the first metal layer in the second insulating layer between the first and second metal layers, a variable resistance element on the contact in the second insulating layer between the first and second metal layers and connected to the second metal layer, and a second bonding pad connected to the second connecting structure arranged in the second insulating layer and has one surface exposed on the third insulating layer. The first bonding pad contacts the second bonding pad.

According to some example embodiments of inventive concepts, an image sensor comprises first, second, and third chips, and a first contact plug connecting the first and second chips. The first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, and a first connecting structure in the first insulating layer and connected to the first transistor. The second chip includes a second insulating layer, including a third surface that contacts the first insulating layer and a fourth surface that is opposite to the third surface, a second semiconductor substrate on the fourth surface of the second insulating layer, a second transistor on the second semiconductor substrate, a second connecting structure in the second insulating layer and connected to the second transistor, and a second contact plug penetrating the second semiconductor substrate and connected to the second transistor. The third chip includes a third insulating layer including a fifth surface contacting the second contact plug and a sixth surface opposite to the fifth surface, a third semiconductor substrate on the sixth surface of the third insulating layer, a third transistor on the third semiconductor substrate, a third connecting structure, which in the third insulating layer connected to the third transistor and including first and second metal layers, a contact connected to the first metal layer in the third insulating layer between the first and second metal layers, and a variable resistance element on the contact in the third insulating layer between the first and second metal layers and connected to the second metal layer. The first contact plug extends from the first surface of the first semiconductor substrate to connect the first and second connecting structures.

According to some example embodiments of inventive concepts, an image sensor comprises first, second, and third chips. The first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, a first connecting structure in the first insulating layer and connected to the first transistor, and a first bonding pad connected to the first connecting structure arranged in the first insulating layer and having one surface exposed on the first insulating layer. The second chip includes a second insulating layer including a third surface contacting the first insulating layer and a fourth surface opposite to the third surface, a second semiconductor substrate on the fourth surface of the second insulating layer, a second transistor on the second semiconductor substrate, a second connecting structure in the second insulating layer and connected to the second transistor, a second contact plug penetrating the second semiconductor substrate and connected to the second transistor, and a second bonding pad connected to the second connecting structure and arranged disposed in the second insulating layer and having one surface exposed on the third surface of the second insulating layer. The third chip includes a third insulating layer including a fifth surface contacting the second contact plug and a sixth surface opposite to the fifth surface, a third semiconductor substrate on the sixth surface of the third insulating layer, a third transistor on the third semiconductor substrate, a third connecting structure in the third insulating layer and connected to the third transistor and including first and second metal layers, a contact connected to the first metal layer in the third insulating layer between the first and second metal layers, and a variable resistance element on the contact in the third insulating layer between the first and second metal layers and connected to the second metal layer. The first bonding pad contacts the second bonding pad.

Other features and example embodiments may be apparent from the following detailed description, the drawings, and the claims.

BRIEF DESCRIPTION OF THE DRAWINGS

The above and other embodiments and features of inventive concepts will become more apparent by describing in detail example embodiments thereof with reference to the attached drawings, in which.

DETAILED DESCRIPTION OF SOME EXAMPLE EMBODIMENTS

Some example embodiments of inventive concepts will hereinafter be described with reference to the accompanying drawings.

Figure 1:
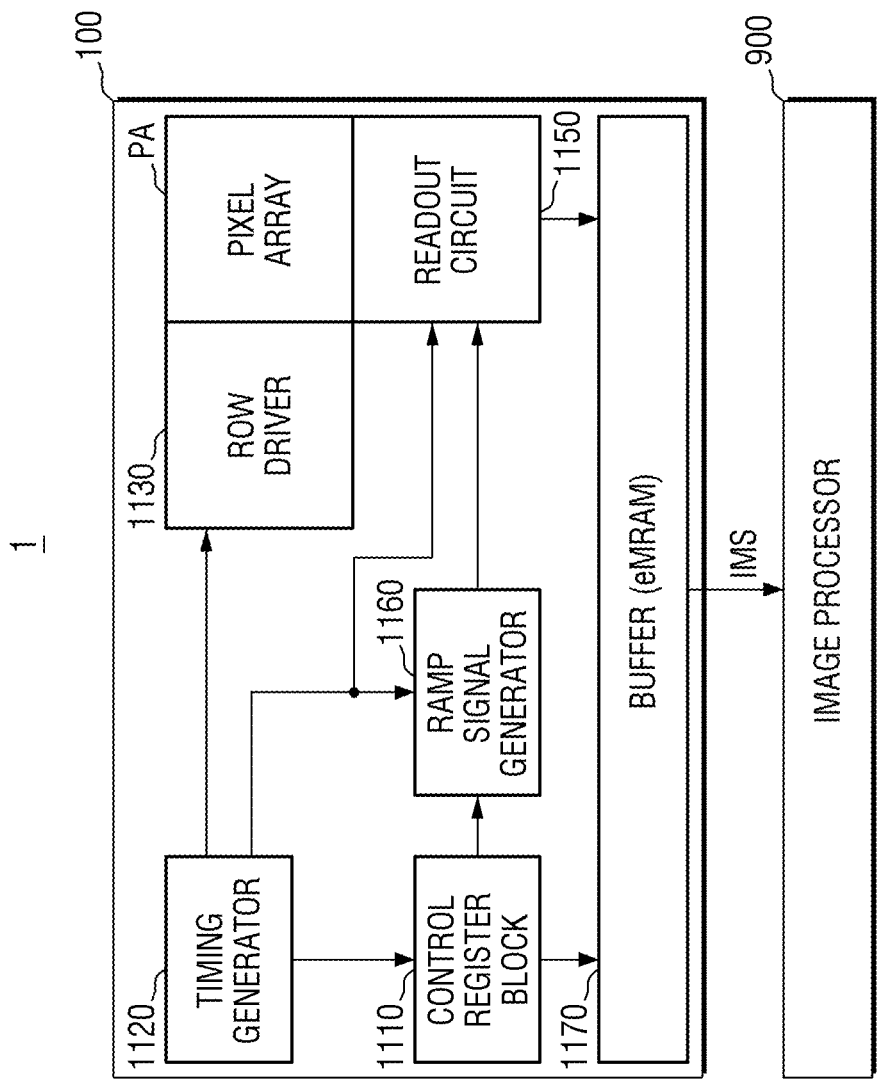
FIG. 1 is a block diagram of an image sensing device according to some example embodiments of inventive concepts.

FIG. 1 is a block diagram of an image sensing device according to some example embodiments of inventive concepts.

Referring to FIG. 1, an image sensing apparatus 1 may include an image sensor 100 and an image processor 900.

The image sensor 100 may generate an image signal IMS by sensing san image of a target object, using light. In some example embodiments, the image signal IMS may be or may include, for example, a digital signal, but inventive concepts are not limited thereto.

The image signal IMS may be provided to, and/or processed by, the image processor 900. The image processor 900 may receive the image signal IMS, which is output from a buffer 1170 of the image sensor 100, and may process the image signal IMS so that the image signal IMS may be suitable to be displayed.

In some example embodiments, the image processor 900 may perform digital binning on the image signal IMS output from the image sensor 100. The image signal IMS output from the image sensor 100 may be or include a raw image signal from a pixel array PA that is yet to be subject to analog binning, or, alternatively, an image signal that has already been subject to analog binning.

In some example embodiments, the image sensor 100 and the image processor 900 may be separate, e.g. on separate substrates. For example, the image sensor 100 may be mounted in a first chip, the image processor 900 may be mounted in a second chip, and the image sensor 100 and the image processor 900 may communicate with each other based on a specific (or, alternatively, a predetermined) interface. However, inventive concepts are not limited to this example. For example, the image sensor 100 and the image processor 900 may be incorporated into a single package, for example, a multichip package (MCP).

The image sensor 100 may include a control register block 1110, a timing generator 1120, a row driver 1130, the pixel array PA, a readout circuit 1150, a ramp signal generator 1160, and the buffer 1170.

The control register block 1110 may generally control the operation of the image sensor 100. The control register block 1110 may transmit operation signals to, e.g. directly to, at least one of the timing generator 1120, the ramp signal generator 1160, and the buffer 1170.

The timing generator 1120 may generate an operation timing reference signal that can be referenced for the operation of various elements of the image sensor 100. The operation timing reference signal may be transmitted to at least one of the row driver 1130, the readout circuit 1150, and the ramp signal generator 1160.

The ramp signal generator 1160 may generate and transmit ramp signals for use in the readout circuit 1150. For example, the readout circuit 1150 may include a correlated double sampler (CDS) and/or a comparator, and the ramp signal generator 1160 may generate and transmit ramp signals for use in the CDS and/or the comparator.

The buffer 1170 may include, for example, a latch such as a flip-flop. The buffer 1170 may temporarily store the image signal IMS and may transmit the image signal IMS to an external memory or an external device. The buffer 1170 may include, for example, an embedded magnetoresistive random-access memory (eMRAM), but inventive concepts are not limited thereto. For example, the buffer 1170 may include a memory such as a dynamic random-access memory (DRAM) and/or a static random-access memory (SRAM).

The pixel array PA may sense an external image. The pixel array PA may include a plurality of pixels (or unit pixels). The row driver 1130 may selectively activate each row of the pixel array PA.

The readout circuit 1150 may sample a pixel signal provided from the pixel array PA, may compare the pixel signal with a ramp signal, and may convert an analog image signal (or data) into a digital image signal (or data) based on the result of the comparison.

Figure 2:
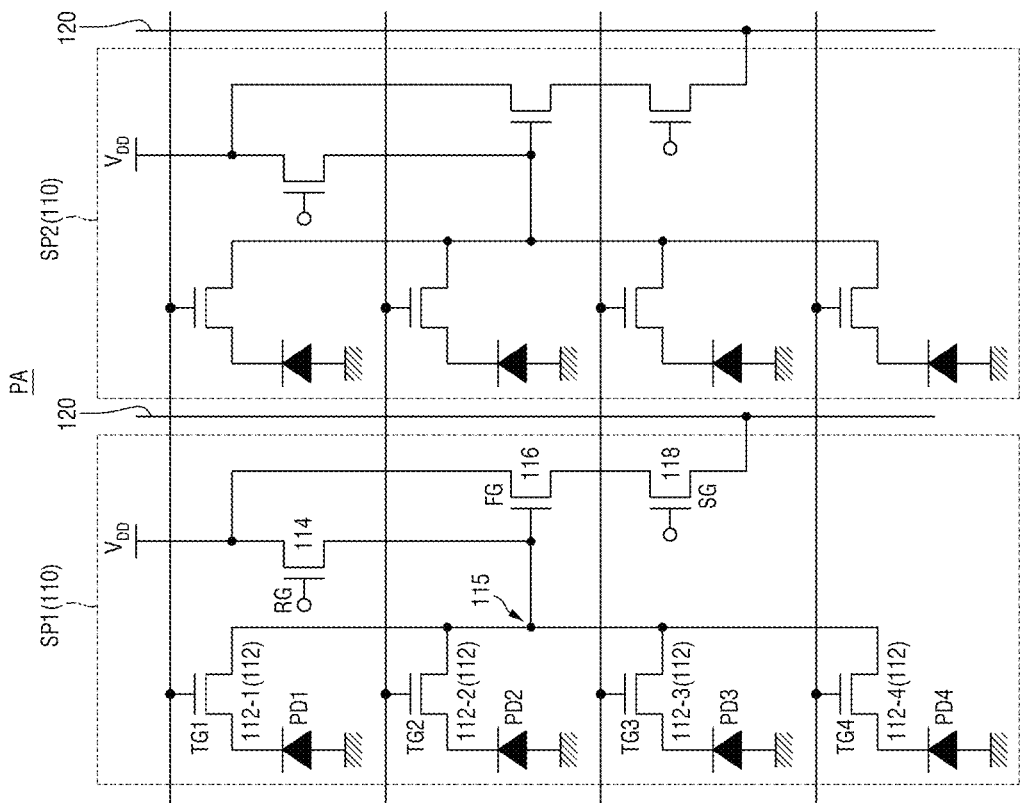
FIGS. 2 and 3 are a circuit diagram and a plan view, respectively, of a unit pixel of the pixel array of FIG. 1.
Figure 3:
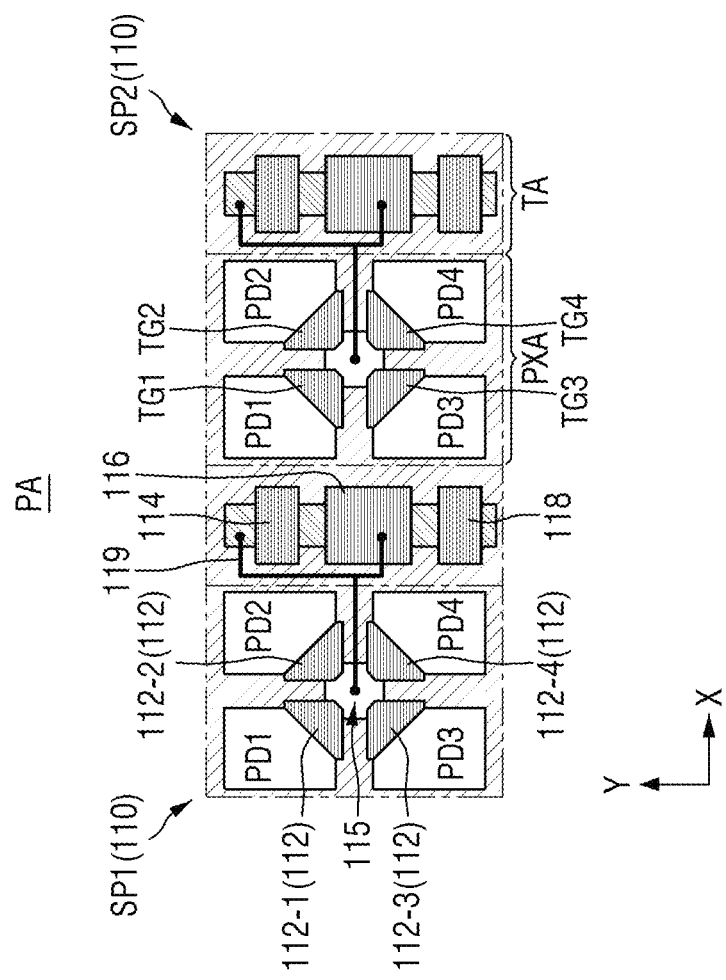

FIGS. 2 and 3 are a circuit diagram and a plan view, respectively, of a unit pixel of the pixel array of FIG. 1.

Referring to FIGS. 2 and 3 in the pixel array PA of the image sensor 100, 4-shared pixels 110 may be arranged two-dimensionally. FIG. 3 illustrates only two 4-shared pixels 110 that are adjacent to each other in a first direction, e.g., first and second 4-shared pixels SP1 and SP2, but in the pixel array PA, multiple 4-shared pixels 110 may be arranged two-dimensionally in the first direction and a second direction that intersects, e.g. that is perpendicular to, the first direction.

Specifically, in the image sensor 100, four pixels may be arranged in a pixel area PXA, and transistors (114, 116, and 118) may be arranged in a transistor area TA. The four pixels may form or correspond to a single 4-shared pixel. The first 4-shared pixel SP1 may have a structure in which four photodiodes, e.g., first through fourth photodiodes PD1 through PD4, surround and share one floating diffusion region 115. Also, the second 4-shared pixel SP2 may have a structure in which four photodiodes, e.g., first through fourth photodiodes PD1 through PD4, share one floating diffusion region 115. In the image sensor 100, one photodiode may form or correspond to or be associated with one pixel.

In each of the 4-shared pixels 110, one floating diffusion region 115 may be shared by four photodiodes connected to transfer transistors 112 corresponding to the four photodiodes. Specifically, a first transfer transistor 112-1 corresponding to a first photodiode PD1, a second transfer transistor 112-2 corresponding to a second photodiode PD2, a third transfer transistor 112-3 corresponding to a third photodiode PD3, and a fourth transfer transistor 112-4 corresponding to a fourth photodiode PD4 may share one floating diffusion region 115 as a common drain region. Each of the first through fourth transfer transistors 112-1 to 112-4 may be or correspond to NMOS transistors and/or may have the same or similar threshold voltages and/or other electrical characteristics; however, example embodiments are not limited thereto.

In each of the 4-shared pixels 110, four photodiodes may share all the transistors except for transfer transistors 112. The four photodiodes, e.g., first through fourth photodiodes PD1 through PD4, may share a reset transistor 114, a source follower transistor 116, and a select transistor 118. The reset transistor 114, the source follower transistor 116, and the select transistor 118 may be arranged in the second direction in the transistor area TA. Each of the reset transistor 114, the source follower transistor 116, and the select transistor 118 may be NMOS transistors and/or may have the same or similar threshold voltages and/or other electrical characteristics; however, example embodiments are not limited thereto.

Referring to FIG. 3, four photodiodes, e.g., first through fourth photodiodes PD1 through PD4, may be connected to the source regions of four transfer transistors 112. The drain regions of the four transfer transistors 112 may be connected to the source region of a reset transistor 114. The common drain region of the transfer transistors 112 may correspond to a floating diffusion region 115. The floating diffusion region 115 may be connected to the gate electrode of a source follower transistor 116, e.g., a source follower gate electrode FG, and the source region of the reset transistor 114, based on wires 119. A common point between the drain region of the reset transistor 114 and the drain region of the source follower transistor 116 may be connected to a power supply voltage VDD. The source region of the source follower transistor 116 and the drain region of a select transistor 118 may be shared, and a column signal line 120 may be connected to the source region of the select transistor 118. The voltage in the source region of the select transistor 118 may be output to the column signal line 120 as an output signal.

Each unit pixel of the pixel array PA may include four shared pixels and a plurality of transistors (e.g. 114, 116, and 118) in a transistor area TA and may also include as many transfer transistors 112 as there are shared photodiodes.

However, inventive concepts are not limited to this. For example, each unit pixel of the pixel array PA may have a 2-shared pixel configuration including two pixels and pixel transistors corresponding to the two pixels or an 8-shared pixel configuration including eight pixels and pixel transistors corresponding to the eight transistors.

Figure 4:
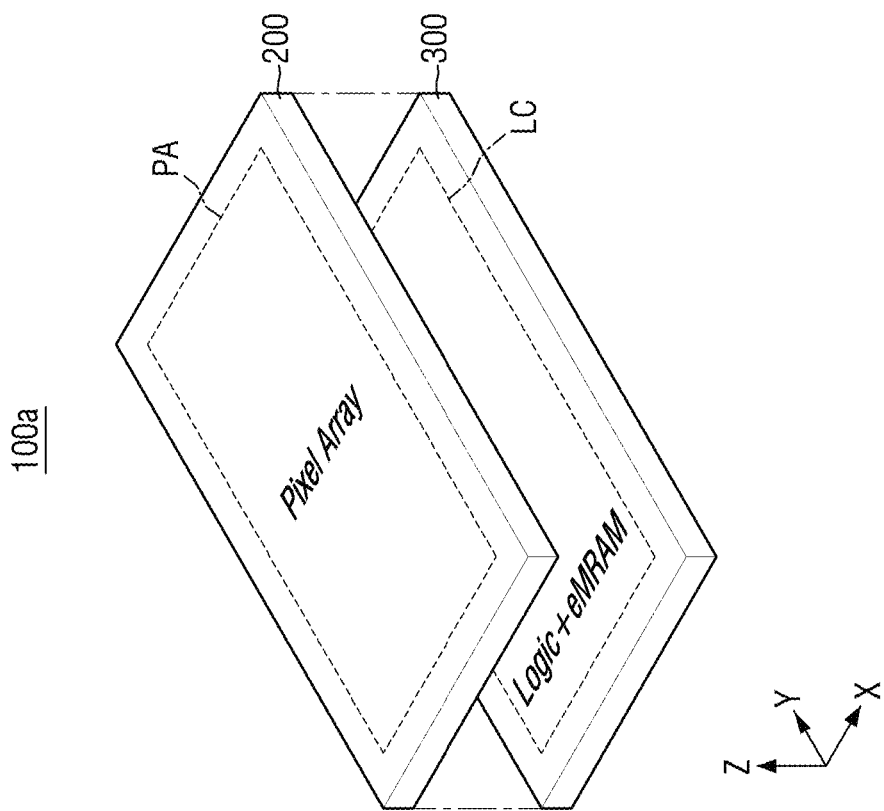
FIG. 4 is a layout view of an image sensor according to some example embodiments of inventive concepts.

FIG. 4 is a layout view of an image sensor according to some example embodiments of inventive concepts.

Referring to FIG. 4, an image sensor 100a may include an upper chip 200 and a lower chip 300 that are stacked. In the upper chip 200, a plurality of pixels may be arranged in the form of an array such as a two-dimensional (2D) array such as a rectangular or square array. For example, the upper chip 200 may include a pixel array PA. The lower chip 300 may include a logic region LC and a memory region. The lower chip 300 may be disposed below the upper chip 200 and may be electrically connected to the upper chip 200. The lower chip 300 may allow pixel signals from the upper chip 200 to be delivered to the logic region LC of the lower chip 300.

Logic elements may be disposed in the logic region LC of the lower chip 300. The logic elements may include circuits such as logic gates and/or registers for processing pixel signals from the pixels. For example, the logic elements may include at least one of the control register block 1110, the timing generator 1120, the row driver 1130, the readout circuit 1150, and the ramp signal generator 1160 of FIG. 1.

A magnetic random access memory (MRAM) may be disposed in the memory region of the lower chip 300. For example, a plurality of MRAM cells may be arranged in the form of a 2D array in the memory region. The MRAM cells may have, e.g. may include, a magnetic tunnel junction (MTJ) structure.

An eMRAM may be disposed in the memory region of the lower chip 300. For example, the buffer 1170 of FIG. 1 may include an eMRAM. The MRAM in the memory region may be formed as an eMRAM. For example, the logic elements in the logic region and the MRAM in the memory region may be formed together, e.g. simultaneously, by a complementary metal-oxide semiconductor (CMOS) process.

The MRAM of the lower chip 300 may be used as an image buffer memory for storing a frame image. Thus, the image sensor 100 may temporarily store a frame image using the MRAM and may perform signal processing on the frame image, thereby reducing or minimizing a wobble effect/jello effect and/or improving the operating properties of the image sensor 100a. Additionally or alternatively, as the MRAM of the image sensor 100a is formed in an embedded form together with the logic elements, the fabrication of the image sensor 100a may be simplified, and/or the size of the image sensor 100a can be reduced. For example, the yield of the image sensor 100a can be increased through the use of an eMRAM, and/or the manufacturing cost of the image sensor 100a can be reduced.

Figure 5:
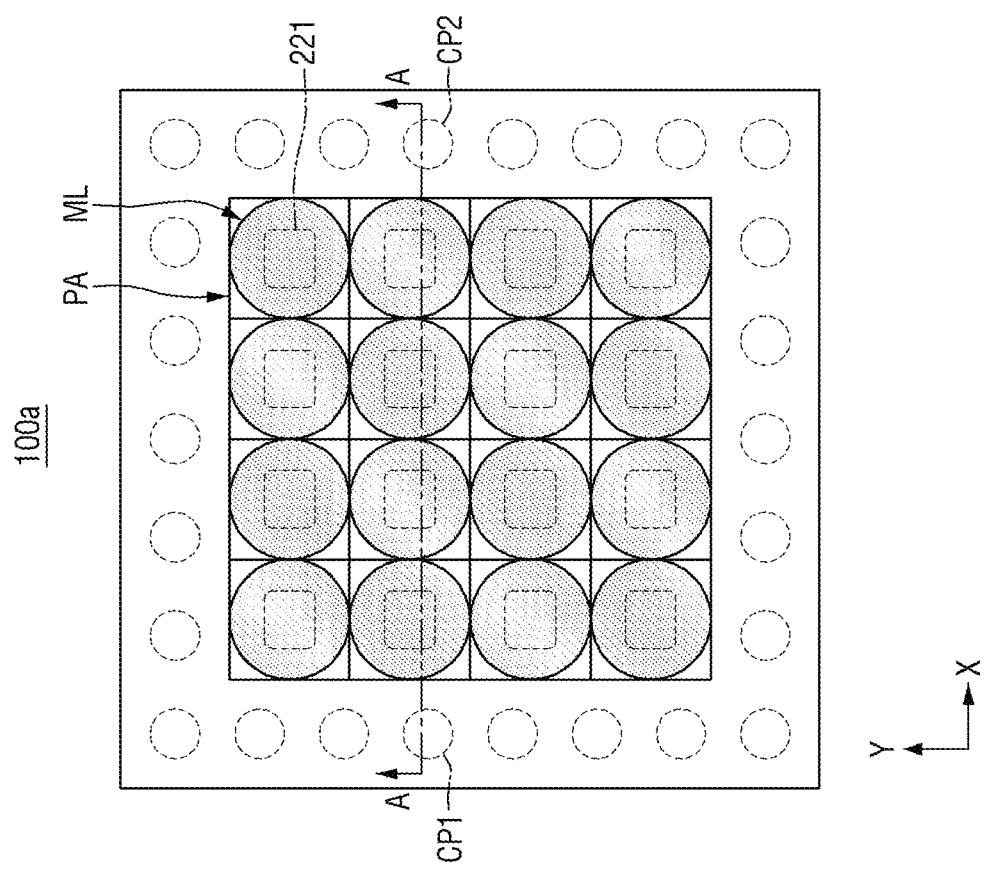
FIG. 5 is a top view of the image sensor of FIG. 4.
Figure 6:
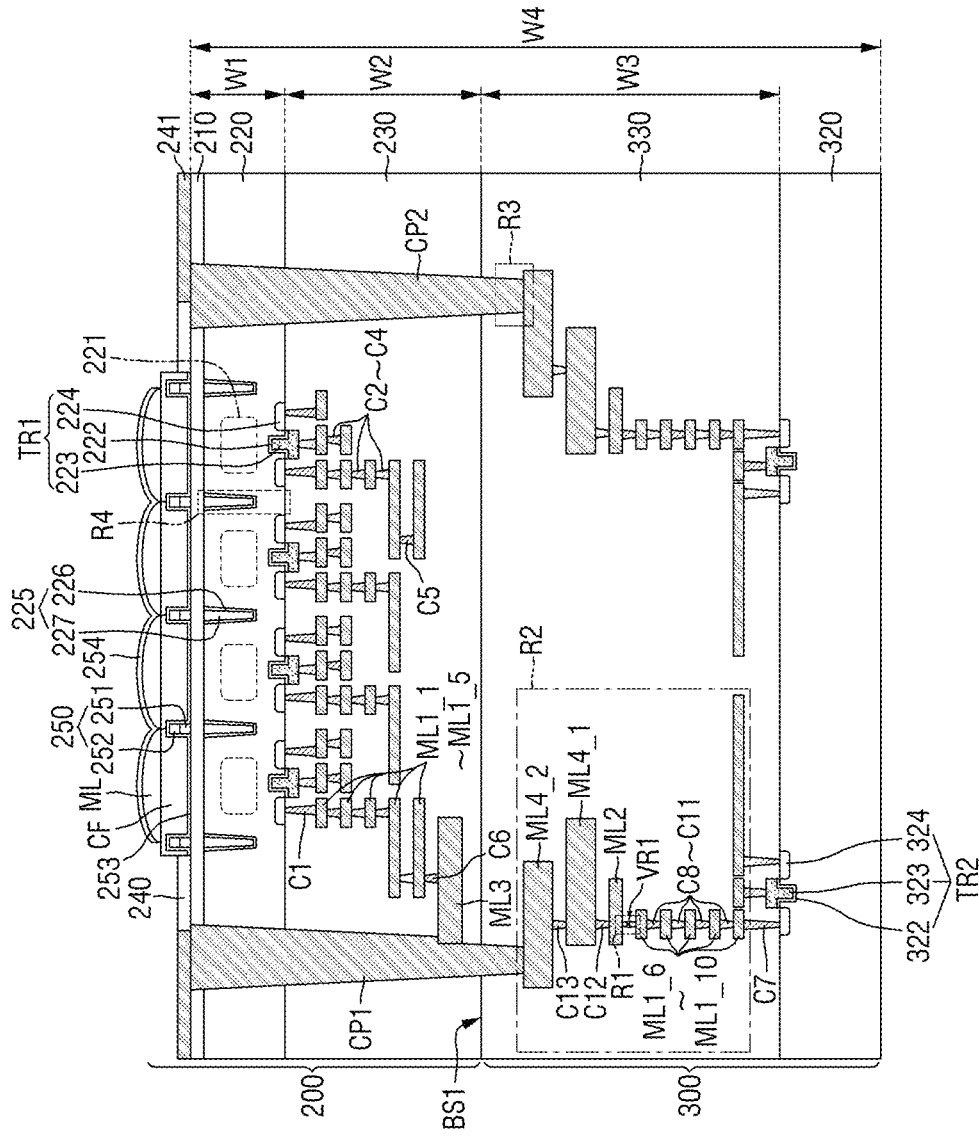
FIG. 6 is a cross-sectional view taken along line A-A of FIG. 5.

FIG. 5 is a top view of the image sensor of FIG. 4. FIG. 6 is a cross-sectional view taken along line A-A of FIG. 5.

Referring to FIG. 5, the pixel array PA may be disposed on the top surface of the image sensor 100a. For example, the pixel array PA may be disposed on the top surface of the upper chip 200 of the image sensor 100a. First contact plugs CP1 and second contact plugs CP2, which connect the upper chip 200 and the lower chip 300, may be disposed outside a region where the pixel array PA is disposed. Microlenses ML may be disposed in the region where the pixel array PA is disposed.

Referring to FIG. 6, the image sensor 100a may include the upper chip 200 and the lower chip 300. The upper chip 200 and the lower chip 300 may be sequentially stacked. For example, the upper chip 200 may be stacked on the lower chip 300.

The upper chip 200 may include a semiconductor substrate 220 such as a single-crystal silicon substrate, photoelectric conversion layers 221, first transistors TR1, and pixel separation patterns 225.

The semiconductor substrate 220 may include, for example, bulk silicon or silicon-on-insulator (SOI), and may be doped, or undoped. The semiconductor substrate 220 may be or include a silicon substrate or may include a material other than (single crystal) silicon, such as, for example, silicon germanium, indium antimonide, a lead tellurium compound, indium arsenic, indium phosphide, gallium arsenide, or gallium antimonide. Alternatively or additionally, the semiconductor substrate 220 may be a base substrate having an epitaxial layer formed thereon. The semiconductor substrate 220 may have a front surface and a rear surface that are opposite to each other. In some example embodiments, the rear surface of the semiconductor substrate 220 may be a light-receiving surface upon which light is incident.

In some example embodiments, the first transistors TR1 may be disposed on the front surface of the semiconductor substrate 220. The first transistors TR1 may include, for example, at least some of various transistors (e.g., a transfer transistor, a reset transistor, a source follower transistor, and a select transistor) that form each unit pixel of the image sensor 100a.

The first transistors TR1 may include gate insulating films 222, gate electrodes 223, and impurity-injected areas 224. The gate insulating films 222 may be formed along trenches formed in the semiconductor substrate 220. The gate electrodes 223 may fill the spaces defined by the gate insulating films 222. The impurity-injected areas 224 may be formed by doping impurities, such as at least one of boron, phosphorus, arsenic, or carbon, into the semiconductor substrate 220. The gate electrodes 223 may serve as the gates of the first transistors TR1, and the impurity-injected areas 224 may serve as the sources/drains of the first transistors TR1.

The pixel separation patterns 225 may be disposed in the semiconductor substrate 220. The pixel separation patterns 225 may define a plurality of unit pixels. The unit pixels may be arranged two-dimensionally in a plan view. For example, the pixel separation patterns 225 may be formed in a lattice shape in a plan view to separate the unit pixels from one another. The pixel separation patterns 225 may be formed by burying deep trenches formed in the semiconductor substrate 220 through patterning with an insulating material.

In some example embodiments, each of the pixel separation patterns 225 may include an insulating spacer film 226 and a conductive filling pattern 227. The insulating spacer film 226 may extend conformally along the side surfaces of a trench in the semiconductor substrate 220. The conductive filling pattern 227 may be formed on the insulating spacer film 226 to fill part of the trench in the semiconductor substrate 220.

The unit pixels may include the photoelectric conversion layers 221. The photoelectric conversion layers 221 may be formed in, e.g. within, the semiconductor substrate 220. The photoelectric conversion layers 221 may generate electric charge in proportion to the amount of light incident that arrives from the outside. The photoelectric conversion layers 221 may be formed by doping impurities such as at least one of phosphorus, arsenic, or boron in the semiconductor substrate 220. For example, in a case where the semiconductor substrate 220 is doped with p-type impurities such as boron, the photoelectric conversion layers 221 may be doped with n-type impurities such as phosphorus and/or arsenic.

The upper chip 200 may include a surface insulating layer 210, a passivation layer 240, grid patterns 250, a first liner 253, color filters CF, microlenses ML, and a second liner 254.

The surface insulating layer 210 may be deposited on the rear surface of the semiconductor substrate 220. The passivation layer 240 may be deposited on the surface insulating layer 210. The grid patterns 250, the first liner 253, the color filters CF, the microlenses ML, and the second liner 254 may be disposed in a region defined by the surface insulating layer 210.

The color filters CF may be formed on the surface insulating layer 210. The color filters CF may be arranged to correspond to the unit pixels. The color filters CF may be arranged two-dimensionally, e.g. in a rectangular or square lattice, in a plan view. The microlenses ML may be formed on the color filters CF. The microlenses ML may be arranged to correspond to the unit pixels. The microlenses ML may have a convex shape with a predetermined radius of curvature. Accordingly, the microlenses ML may condense light incident upon the photoelectric conversion layers 221. The microlenses ML include, for example, a light-transmitting resin, but inventive concepts are not limited thereto.

The grid patterns 250 may be formed between the color filters CF. The grid patterns 250 may be formed on the surface insulating layer 210. The grid patterns 250 may include, for example, metal patterns 251 and/or low refractive index patterns 252. The metal patterns 251 and the low refractive index patterns 252 may be sequentially stacked on the surface insulating layer 210.

The first liner 253 may be formed on the surface insulating layer 210 and on the grid patterns 250. The first liner 253 may extend along the surfaces of the surface insulating layer 210 and the grid patterns 250. The first liner 253 may include, for example, aluminum oxide, but inventive concepts are not limited thereto.

The second liner 254 may extend along the surfaces of the microlenses ML. The second liner 254 may include, for example, an inorganic oxide film (e.g., silicon oxide, titanium oxide, zirconium oxide, hafnium oxide, or a combination thereof), but inventive concepts are not limited thereto.

The upper chip 200 may include an inter-wire insulating layer 230 and a connecting structure. The connecting structure may be formed in the inter-wire insulating layer 230. The connecting structure may include a plurality of first metal layers (ML1_1 through ML1_5), a third metal layer ML3, and a plurality of contacts (C1, C2 through C4, C5, and C6).

The first metal layers (ML1_1 through ML1_5) may be formed in the inter-wire insulating layer 230. The first metal layers (ML1_1 through ML1_5) may be sequentially arranged from the surface where the first transistors T1 are located. For example, first metal layers ML1_1 may be closest to the first transistors TR1, and first metal layers ML1_4 may be farthest from the first transistors TR1. The third metal layer ML3 may be disposed on the first metal layers (ML1_1 through ML1_5).

The first metal layers (ML1_1 through ML1_5) may have the same thickness. The first metal layers (ML1_1 through ML1_5) may have a different thickness from the third metal layer ML3. For example, the thickness of the third metal layer ML3 may be greater than the thickness of the first metal layers (ML1_1 through ML1_5), but inventive concepts are not limited thereto.

The first metal layers (ML1_1 through ML1_5) and the third metal layer ML3 may be connected by the contacts (C1, C2 through C4, C5, and C6). For example, the first metal layers ML1_1 may be connected to the impurity-injected areas 224 of the first transistors TR1 by first contacts C1. The first metal layers (ML1_1 through ML1_5) and the third metal layer ML3 may be connected by the contacts (C1, C2 through C4, C5, and C6). As a result, electrical signals from the photoelectric conversion layers 221 may be transmitted via the first transistors TR1, the first metal layers (ML1_1 through ML1_5), the third metal layer ML3, and the contacts (C1, C2 through C4, C5, and C6).

The first metal layers (ML1_1 through ML1_5), the third metal layer ML3, and the contacts (C1, C2 through C4, C5, and C6) may each include a conductive material such as the same or different conductive materials. For example, the first metal layers (ML1_1 through ML1_5), the third metal layer ML3, and the contacts (C1, C2 through C4, C5, and C6) may include a metallic material such as copper and/or lead.

The lower chip 300 may be disposed below the upper chip 200. The lower chip 300 and the upper chip 200 may be in contact, e.g. in direct contact, with each other at a first bonding surface BS1. The upper chip 200 and the lower chip 300 may be connected by the first contact plugs CP1 and the second contact plugs CP2.

The lower chip 300 may include a semiconductor substrate 320, second transistors TR2, an inter-wire insulating layer 330, variable resistance elements VR1, and a connecting structure. The connecting structure may be formed in the inter-wire insulating layer 330. The connecting structure may include a plurality of first metal layers (ML1_6 through ML1_10), second metal layers ML2, fourth metal layers (ML4_1 and ML4_2), and a plurality of contacts (C7, C8 through C11, C12, and C13).

The semiconductor substrate 320 may include, for example, undoped or lightly doped single-crystal silicon such as bulk silicon or SOI. The semiconductor substrate 320 may be a silicon substrate or may include a material other than single-crystal silicon, such as, for example, silicon germanium, indium antimonide, a lead tellurium compound, indium arsenic, indium phosphide, gallium arsenide, or gallium antimonide, and may be the same, or different, materials than that of the semiconductor substrate 220.

The second transistors TR2 may be disposed on the front surface of the semiconductor substrate 320. The second transistors TR2 may be implemented as logic elements such as components of the control register block 1110, the timing generator 1120, the row driver 1130, the readout circuit 1150, and the ramp signal generator 1160 of FIG. 1. The second transistors TR2 may include gate insulating films 322, gate electrodes 323, and impurity-injected areas 324.

The second transistors TR2, the first contact plugs CP1, and the second contact plugs CP2 may be connected by the connecting structure of the lower chip 300.

The semiconductor substrate 220 may have a first thickness W1, and the inter-wire insulating layer 230 may have a second thickness W2. The inter-wire insulating layer 330 may have a third thickness W3, and the upper chip 200 and the lower chip 300 may have a fourth thickness W4.

The first thickness W1 may be smaller than the second and third thicknesses W2 and W3. The second thickness W2 may be smaller than the third thickness W3. The fourth thickness W4 may be smaller than the sum of the first, second, and third thicknesses W1, W2, and W3.

The first metal layers (ML1_6 through ML1_10) may be formed in the inter-wire insulating layer 330. The first metal layers (ML1_6 through ML1_10) may be sequentially arranged from the surface where the second transistors TR2 are located.

The first metal layers (ML1_6 through ML1_10) may have the same thickness. The first metal layers (ML1_6 through ML1_10), the second metal layers ML2, and the fourth metal layers (ML4_1 and ML4_2) may have different thicknesses. The thickness of the second metal layers ML2 may be greater than the thickness of the first metal layers (ML1_6 through ML1_10). The thickness of the fourth metal layers (ML4_1 and ML4_2) may be greater than the thickness of the second metal layers ML2. However, inventive concepts are not limited to this.

The first metal layers (ML1_6 through ML1_10), the second metal layers ML2, and the fourth metal layers (ML4_1 and ML4_2) may be connected by the contacts (C7, C8 through C11, C12, and C13). For example, a plurality of contacts (C7 and C8 through C11) may connect the first metal layers (ML1_6 through ML1_10). For example, a plurality of contacts (C12 and C13) may connect the second metal layers ML2 and the fourth metal layers (ML4_1 and ML4_2).

First metal layers ML1_10 and the second metal layers ML2 may be connected by contacts BEC1 and by the variable resistance elements VR1. For example, the contacts BEC1 and the variable resistance elements VR1 may be disposed between the first metal layers ML1_10 and the second metal layers ML2, while the other metal layers are connected by the contacts (C7, C8 through C11, C12, and C13).

Figure 7:
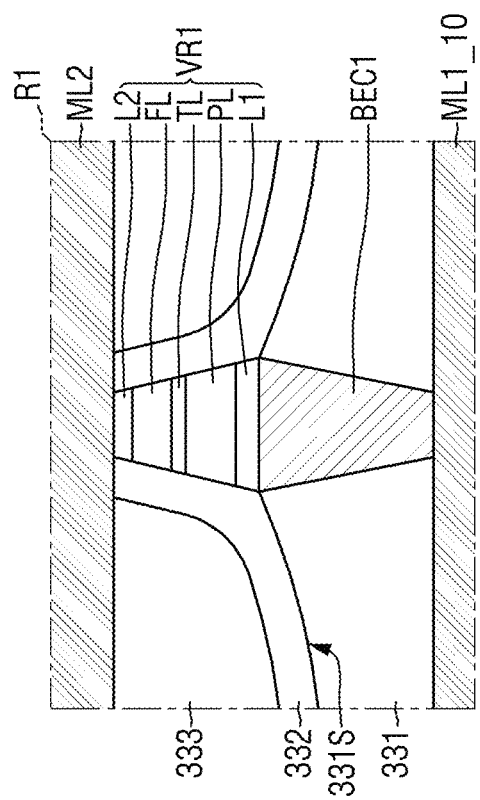
FIG. 7 is an enlarged cross-sectional view of a region R1 of FIG. 6.

FIG. 7 is an enlarged cross-sectional view of a region R1 of FIG. 6.

Referring to FIG. 7, a contact BEC1 and a variable resistance element VR1 may be disposed between a first metal layer ML1_10 and a second metal layer ML2. For example, the contact BEC1 and the variable resistance element VR1 may connect or directly connect the first metal layer ML1_10 and the second metal layer ML2.

The contact BEC1 may be disposed on the first metal layer ML1_10 and may be connected to the first metal layer ML1_10. The contact BEC1 may have a shape that is narrower at the bottom thereof than at the top thereof, but inventive concepts are not limited thereto. The variable resistance element VR1 may be formed on the contact BEC1. The variable resistance element VR1 may connect the contact BEC1 and the second metal layer ML2.

The inter-wire insulating layer 330 may include a plurality of layers. For example, the inter-wire insulating layer 330 may include a first insulating layer 331, a capping film 332, and a second insulating layer 333. The first insulating layer 331 may be formed on (e.g. directly on) the first metal layer ML1_10. The first insulating layer 331 may be formed to surround the contact BEC1. For example, the first insulating layer 331 may be formed along the sidewalls of the contact BEC1 and the top surface of the first metal layer ML1_10. A top surface 331S of the first insulating layer 331 may be downwardly recessed.

The capping film 332 may be formed along the top surface 331S of the first insulating layer 331 and along the sidewalls of the variable resistance element VR1. For example, the capping film 332 may be formed to surround or fully surround the variable resistance element VR1. The capping film 332 may protect or partially protect the variable resistance element VR1 from the outside. The capping film 332 may be formed along the top surface 331S of the first insulating layer 331 to be downwardly recessed.

The second insulating layer 333 may be formed on (e.g. directly on) the capping film 332. For example, the second insulating layer 333 may be formed between the capping film 332 and the second metal layer ML2.

The variable resistance element VR1 may be or include an MTJ device. In this case, the variable resistance element VR1 may be or include a nonvolatile memory device. Data may be temporarily stored in and/or may be read out from the variable resistance element VR1.

The variable resistance element VR1 may include a first layer L1, a fixed layer PL, a tunnel layer TL, a free layer FL, and a second layer L2. The first layer L1, the fixed layer PL, the tunnel layer TL, the free layer FL, and the second layer L2 may be sequentially deposited.

The first layer L1 may be formed on the contact BEC1. The first layer L1 may include a metal nitride such as at least one of tantalum nitride, titanium nitride, or tungsten nitride.

The fixed layer PL may be formed on the first layer L1. The fixed layer PL may include at least one of iron manganese (FeMn), iridium manganese (IrMn), platinum manganese (PtMn), manganese oxide (MnO), manganese sulfide (MnS), manganese tellurium (MnTe), manganese fluoride ($MnF_2$), iron fluoride ($FeF_2$), iron chloride ($FeCl_2$), iron oxide (FeO), cobalt chloride ($CoCl_2$), cobalt oxide (CoO), nickel chloride ($NiCl_2$), nickel oxide (NiO), or chromium (Cr).

The tunnel layer TL may be formed on the fixed layer PL. The tunnel layer TL may include aluminum oxide and/or magnesium oxide.

The free layer FL may be formed on the tunnel layer TL. The free layer FL may include a ferromagnetic material including at least one of iron (Fe), nickel (Ni), and cobalt (Co).

The second layer L2 may be formed on the free layer FL. The second layer L2 may include a metal such as at least one of tantalum, titanium, or tungsten or a metal nitride such as titanium nitride or tantalum nitride.

Figure 8:
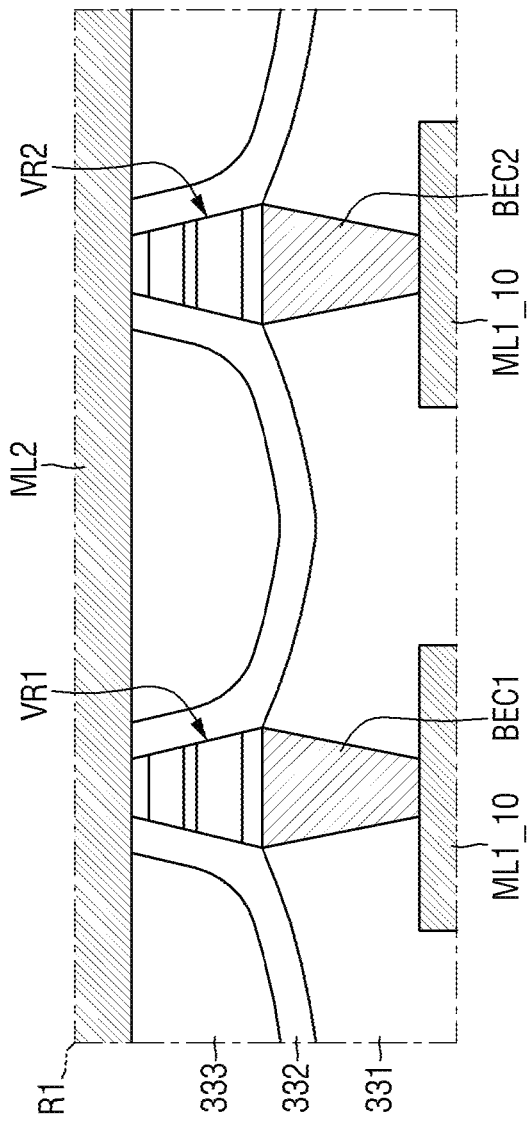
FIG. 8 is an enlarged cross-sectional view of the region R1 of FIG. 6.

FIG. 8 is an enlarged cross-sectional view of the region R1 of FIG. 6.

Referring to FIG. 8, a contact BEC1 and a variable resistance element VR1 may be formed between a first metal layer ML1_10 and a second metal layer ML2, and a contact BEC2 and a variable resistance element VR2 may be formed between another first metal layer ML1_10 and the second metal layer ML2. For example, different variable resistance elements, e.g., the variable resistance elements VR1 and VR2, may be formed to be spaced apart from each other A first insulating layer 331 may be formed along the first metal layers ML1_10 and the contacts BEC1 and BEC2. The first insulating layer 331 may be downwardly recessed. A capping film 332 may be formed along the top surface of the first insulating layer 331 and the sidewalls of each of the contacts BEC1 and BEC2. A second insulating layer 333 may be formed between the capping film 332 and the second metal layer ML2.

FIGS. 9 through 13 are cross-sectional views illustrating the fabrication of contacts and variable resistance elements according to some example embodiments.

Figure 9:
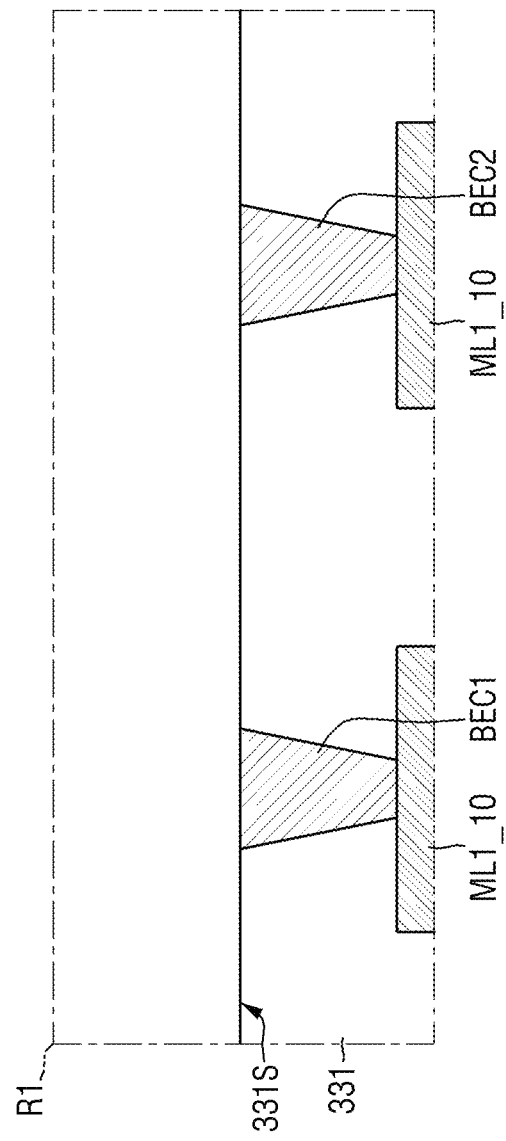
FIGS. 9 through 13 are cross-sectional views illustrating the fabrication of contacts and variable resistance elements.

Referring to FIG. 9, first metal layers ML1_10 and contacts BEC1 and BEC2 may be formed in a first insulating layer 331. The contacts BEC1 and BEC2 may be formed by forming trenches through the etching of the first insulating layer 331, and filling the trenches with a conductive material. The conductive material may be deposited with at least one of a physical vapor deposition (PVD) process, a chemical vapor deposition (CVD) process, or an electrochemical deposition process such as a plating process.

The top surface of the first insulating layer 331 may be the top surface 331S of the first insulating layer 331 of FIG. 7. The top surface 331S of the first insulating layer 331 may be flat/planar. For example, the top surface 331S of the first insulating layer 331 may be placed on the same plane as the exposed top surfaces of the contacts BEC1 and BEC2.

Figure 10:
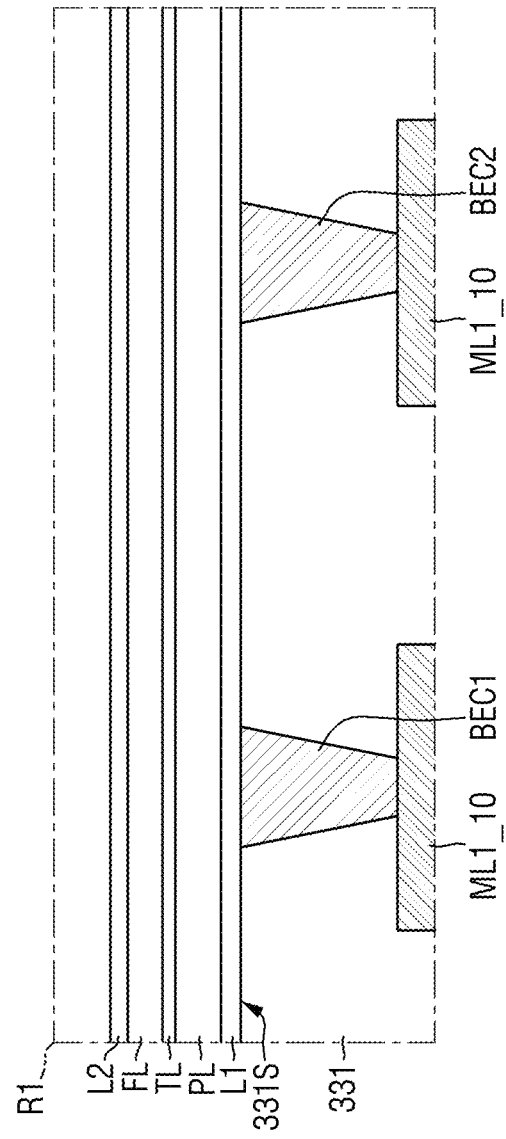

Referring to FIG. 10, a first layer L1, a fixed layer PL, a tunnel layer TL, a free layer FL, and a second layer L2 may be sequentially deposited on the first insulating layer 331. For example, the first layer L1, the fixed layer PL, the tunnel layer TL, the free layer FL, and the second layer L2 may be sequentially formed on the top surface 331S of the first insulating layer 331.

Figure 11:
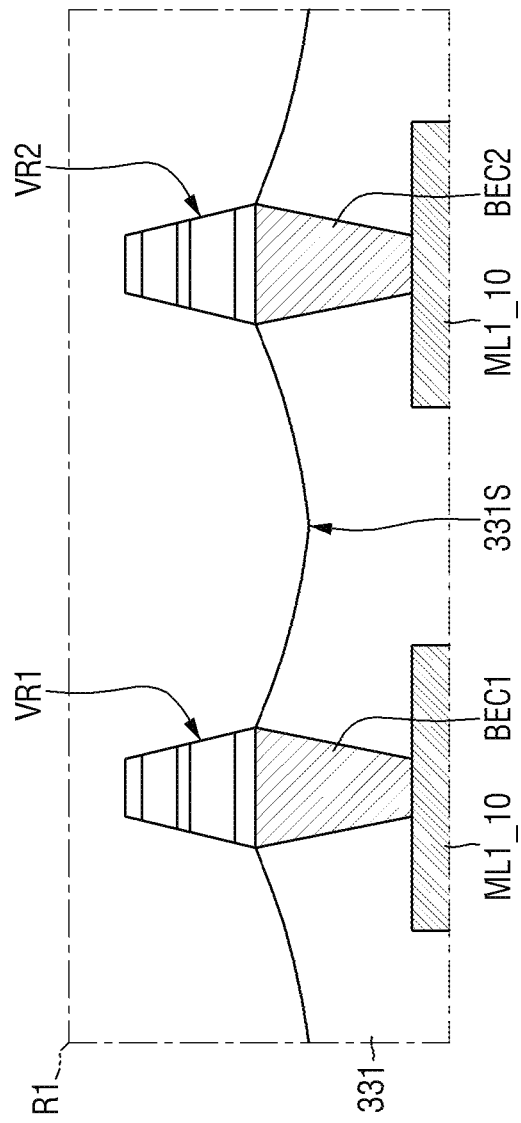

Referring to FIG. 11, variable resistance elements VR1 and VR2 may be formed by patterning the first layer L1, the fixed layer Pl, the tunnel layer TL, and the free layer FL through etching using the second layer L2 as an etching mask. The patterning of the first layer L1, the fixed layer Pl, the tunnel layer TL, and the free layer FL may be performed by an etching process such as ion beam etching (IBE) using argon (Ar) and/or krypton (Kr) ions.

As a result of an IBE process, the first layer L1, the fixed layer Pl, the tunnel layer TL, the free layer FL, and the second layer L2 may be etched. For example, the variable resistance elements VR1 and VR2 may be formed by etching away the entire first layer L1, the entire fixed layer Pl, the entire tunnel layer TL, the entire free layer FL, and the entire second layer L2, except for parts that are to be defined as the variable resistance elements VR1 and VR2.

The width of the bottoms of the variable resistance elements VR1 and VR2 may be greater than the width of the tops of the variable resistance elements VR1 and VR2.

The first insulating layer 331 may be recessed by the IBE process. For example, the top surface 331S of the first insulating layer 331 may be downwardly recessed. For example, the top surface 331S of the first insulating layer 331 may be downwardly recessed between the variable resistance elements VR1 and VR2.

Figure 12:
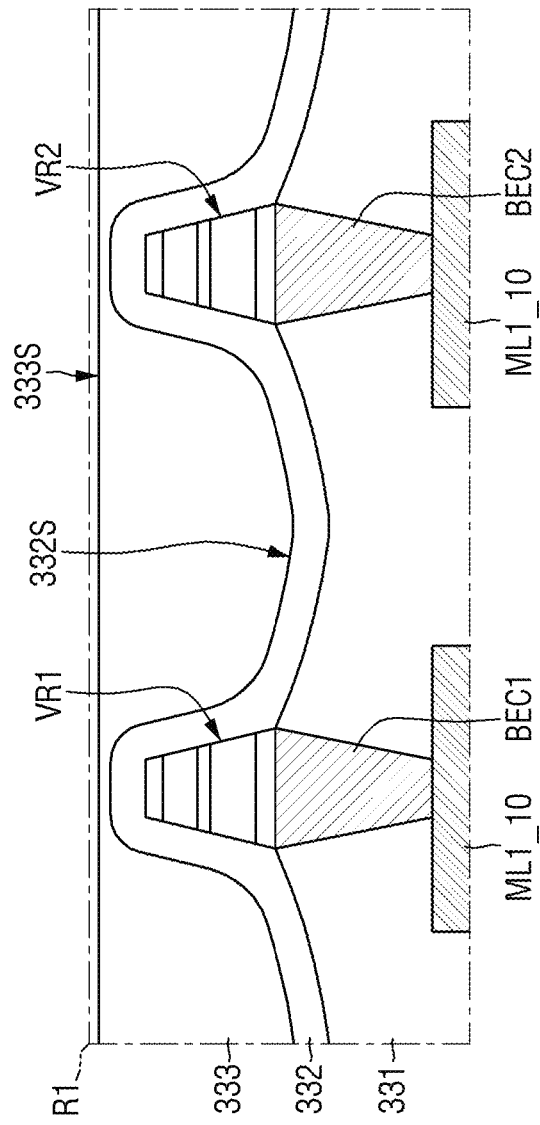

Referring to FIG. 12, a capping film 332 may be formed on the first insulating layer 331. The capping film 332 may be formed along the top surface 331S of the first insulating layer 331, the sidewalls and the top surface of the variable resistance element VR1, and the sidewalls and the top surface of the variable resistance element VR2. The capping film 332 may be formed with a CVD process; however, example embodiments are not limited thereto. The capping film 332 may be conformally formed along the first insulating layer 331 and the variable resistance elements VR1 and VR2. The top surface 331S of the first insulating layer 331 may be downwardly recessed. For example, the top surface 331S of the first insulating layer 331 may be downwardly recessed between the variable resistance elements VR1 and VR2.

A second insulating layer 333 may be formed on the capping film 332. The second insulating layer 333 may cover a top surface 332S of the capping film 332. The second insulating layer 333 may completely cover the capping film 332. For example, the capping film 332 may not be exposed on a top surface 333S of the second insulating layer 333.

Figure 13:
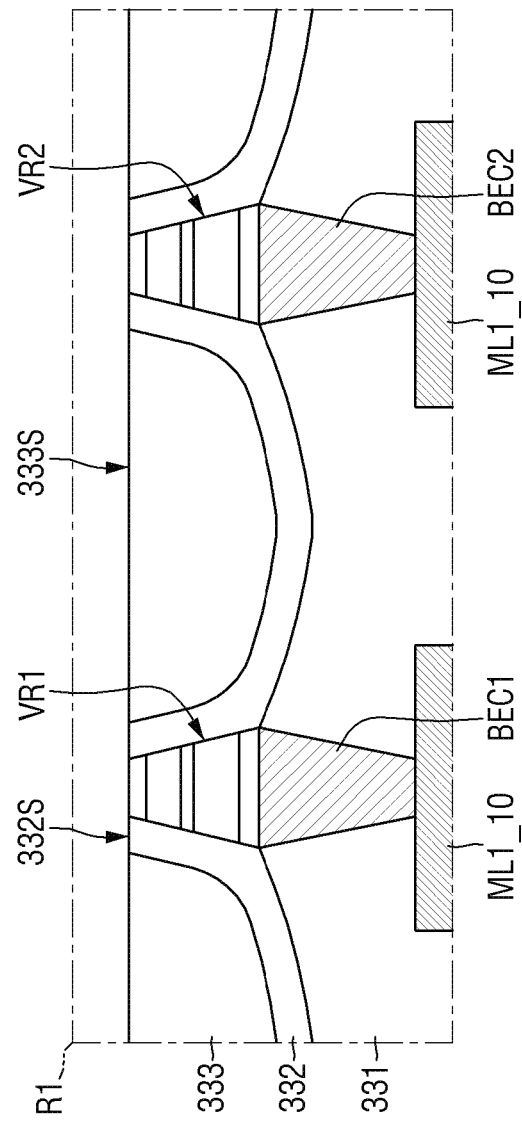

Referring to FIG. 13, the top surface 333S of the second insulating layer 333 may be etched. As the top surface 333S of the second insulating layer 333 is etched, the capping film 332 and the variable resistance elements VR1 and VR2 may be exposed at the top surface 333S of the second insulating layer 333. For example, the top surface 332S of the capping film 332 may be exposed at the top surface 333S of the second insulating layer 333. Additionally, the top surfaces of the variable resistance elements VR1 and VR2 may be exposed at the top surface 333S of the second insulating layer 333.

Thereafter, a second metal layer ML2 may be formed on the top surface 333S of the second insulating layer 333. The second metal layer ML2 may be connected, e.g. directly connected to the variable resistance elements VR1 and VR2. The first metal layers ML1_10 may be electrically connected to the second metal layer ML2 via the contacts BEC1 and BEC2 and the variable resistance elements VR1 and VR2. The variable resistance elements VR1 and VR2 may be disposed between the first metal layers ML1_10 and the second metal layer ML2, and data may be stored in the variable resistance elements VR1 and VR2.

Referring again to FIG. 6, the first contact plugs CP1 and the second contact plugs CP2 may connect the upper chip 200 and the lower chip 300 to each other.

The first contact plugs CP1 may extend from the top surface of the semiconductor substrate 220. The first contact plugs CP1 may extend to the fourth metal layers ML4_2 of the lower chip 300. The first contact plugs CP1 may be connected to the third metal layer ML3 of the upper chip 200. The first contact plugs CP1 may be formed by filling trenches formed along the edges of each of the upper chip 200 and the lower chip 300 with a conductive material and may connect the upper chip 200 and the lower chip 300. Additionally, the first contact plugs CP1 may fix the upper chip 200 and the lower chip 300.

Pads 241 may be formed on the first contact plugs CP1. The pads 241 may be connected to the first contact plugs CP1 and may transmit signals to, and/or receive signals from, the first contact plugs CP1.

The second contact plugs CP2 may extend from the top surface of the semiconductor substrate 220. The second contact plugs CP2 may extend to the fourth metal layers ML4_2 of the lower chip 300. The second contact plugs CP2 may be spaced apart from the first contact plugs CP1. The second contact plugs CP2 may be formed by filling trenches formed along the edges of each of the upper chip 200 and the lower chip 300 with a conductive material and may connect the upper chip 200 and the lower chip 300. Additionally, the second contact plugs CP2 may fix the upper chip 200 and the lower chip 300.

Pads 241 may be formed on the second contact plugs CP2. The pads 241 may be connected to the second contact plugs CP2 and may transmit signals to, and/or receive signals from, the second contact plugs CP2.

Referring to FIG. 5, the first contact plugs CP1 and the second contact plugs CP2 may be disposed in an edge area of the image sensor 100a. For example, the first contact plugs CP1 and the second contact plugs CP2 may be disposed on the outside of the region where the pixel array PA is disposed, but inventive concepts are not limited thereto.

Figure 14:
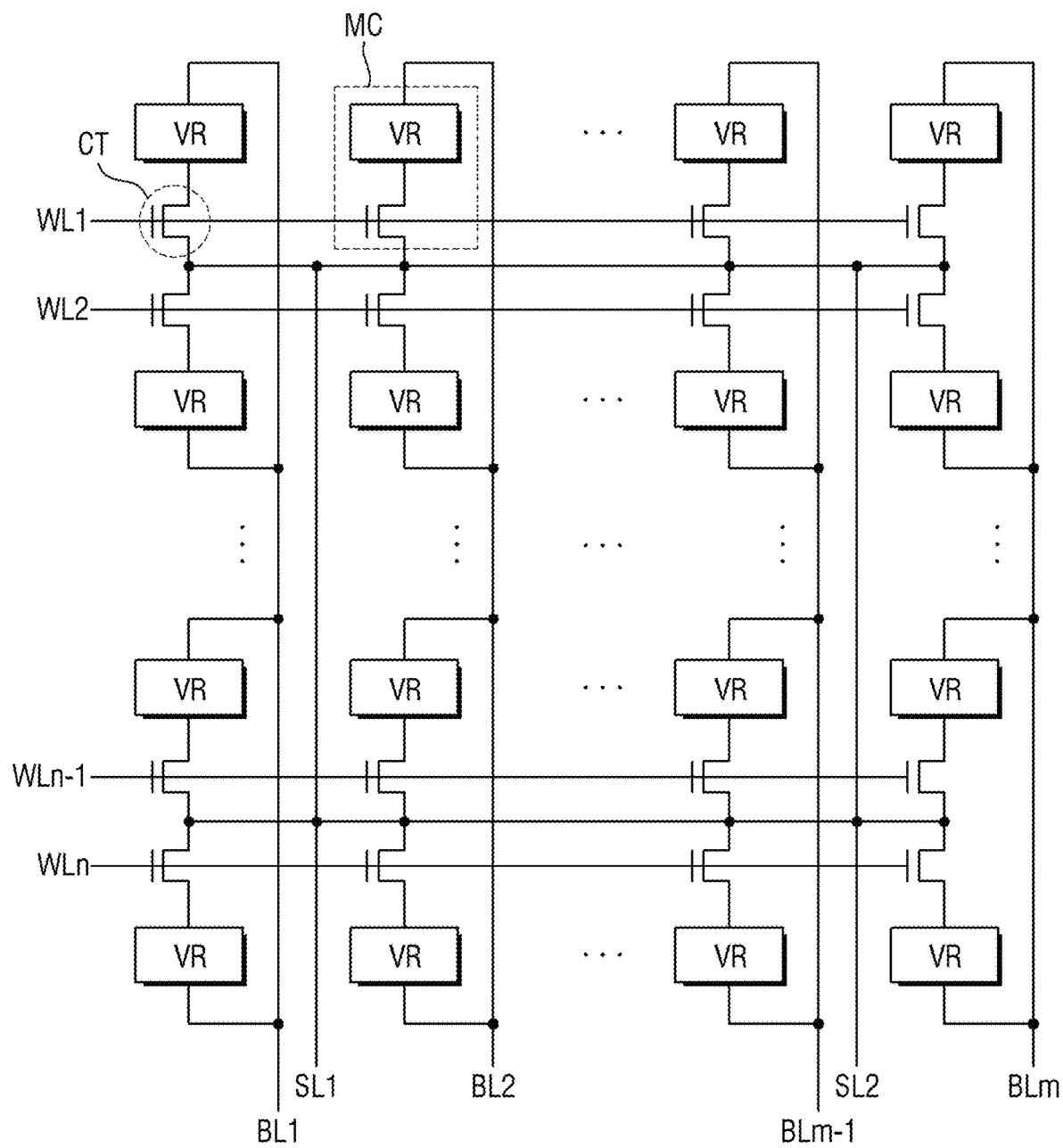
FIG. 14 is a circuit diagram of a memory cell array according to some example embodiments of inventive concepts.
Figure 15:
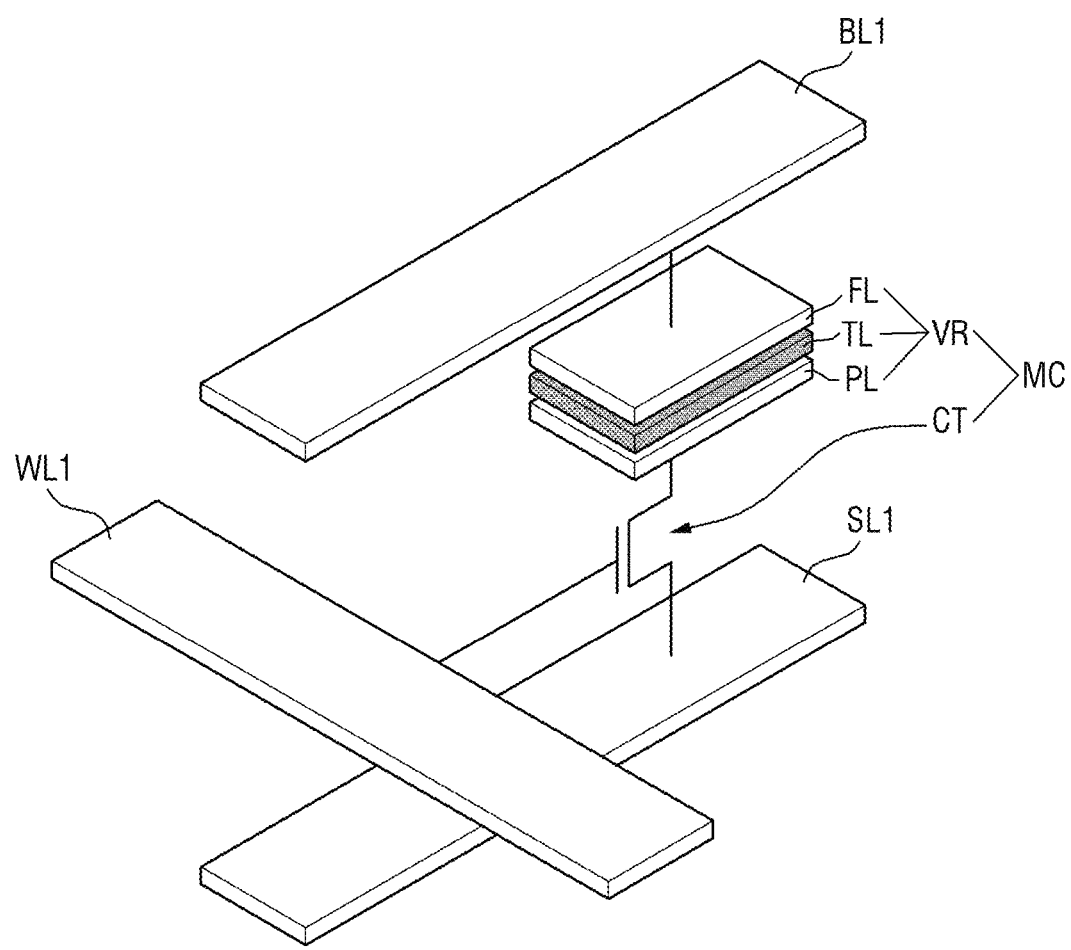
FIG. 15 is a perspective view of a memory cell of the memory cell array of FIG. 14.
Figure 16:
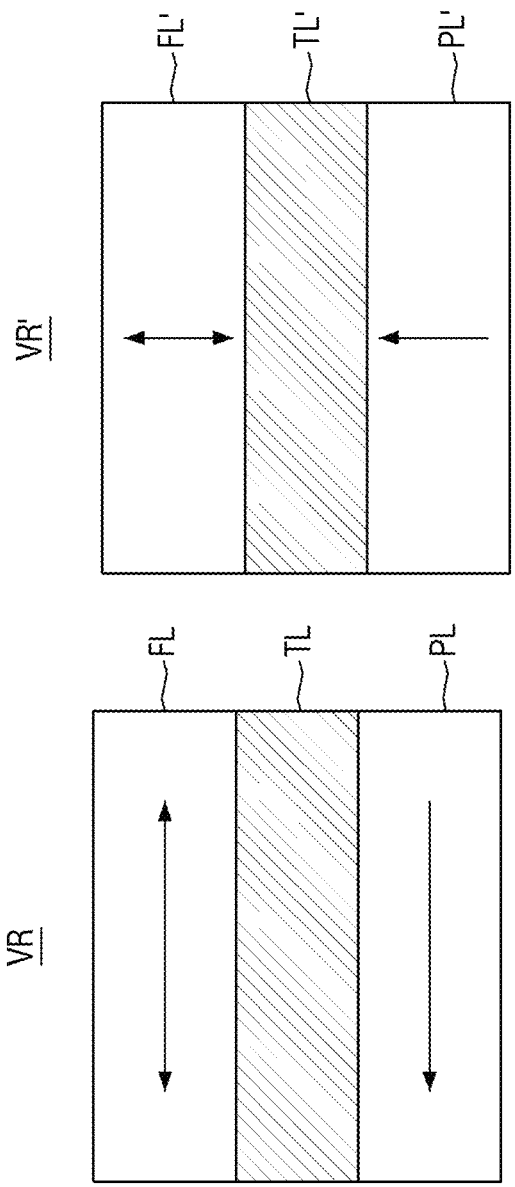
FIG. 16 illustrates cross-sectional views of variable resistance elements according to some example embodiments of inventive concepts.

FIG. 14 is a circuit diagram of a memory cell array according to some example embodiments of inventive concepts. FIG. 15 is a perspective view of a memory cell of the memory cell array of FIG. 14. FIG. 16 illustrates cross-sectional views of variable resistance elements according to some example embodiments of inventive concepts.

Referring to FIGS. 14 and 15, the memory cell array may include a plurality of memory cells MC. The memory cells MC may be arranged in row and column directions. The memory cells MC may include, for example, variable resistance elements VR and cell transistors CT.

The gates of the cell transistors CT may be connected to first through n-th wordlines WL1 through WLn. The gates of cell transistors CT in one row may be connected in common to one wordline (e.g., the first wordline WL1), and the gates of cell transistors CT in another row may be connected in common to another wordline.

First ends of the cell transistors CT may be connected to first ends of the variable resistance elements VR. Second ends of the cell transistors CT may be connected to source lines (e.g., first and second source lines SL1 and SL2). The second ends of a pair of adjacent cell transistors CT may be connected in common to one source line (e.g., the first source line SL1).

The first ends and second ends of the variable resistance elements VR may be connected to first through m-th bitlines BL1 through BLm. The second ends of variable resistance elements VR in one column may be connected in common to one bitline (e.g., the first bitline BL1). The number m of bitlines BL1 to BLm may be the same as, greater than, or less than the number n of word lines WL1 to WLn.

The variable resistance elements VR may have either a low-resistance state or a high-resistance state depending on bias conditions. By controlling the variable resistance elements VR to be in one of the low- and high-resistance states, data can be stored in the variable resistance elements VR. Furthermore a resistance of the variable resistance elements VR may be variable such that more than one bits are stored in the variable resistance element VR; however, example embodiments are not limited thereto.

Referring to FIG. 15, a variable resistance element VR may include a free layer FL, a fixed layer PL, and a tunnel layer TL. For example, the free layer FL, the fixed layer PL, and the tunnel layer TL may be disposed between the first bitline BL1 and a cell transistor CT. The tunnel layer TL may be disposed between the free layer FL and the fixed layer PL.

The first bitline BL1 may correspond to the second metal layer ML2, the first wordline WL1 may correspond to a first metal layer ML1_6, and the first source line SL1 may correspond to another first metal layer ML1_6.

Referring to FIG. 16, the magnetization direction of a fixed layer PL of a variable resistance element VR may be fixed. The magnetization direction of a free layer FL of the variable resistance element VR may coincide with, or alternatively be or become opposite to, the magnetization direction of the fixed layer PL depending on bias conditions.

If the magnetization direction of the free layer FL is parallel to (or coincides with) the magnetization direction of the fixed layer PL, the resistance of the variable resistance element VR may be reduced. If the magnetization direction of the free layer FL is anti-parallel to the magnetization direction of the fixed layer PL, the resistance of the variable resistance element VR may be increased.

For example, if a current flows from the free layer FL to the fixed layer PL, electrons may move from the fixed layer PL to the free layer FL. The electrons that flow in the fixed layer PL may rotate in accordance with the magnetization direction of the fixed layer PL. Due to the electrons flowing in accordance with the magnetization direction of the fixed layer PL, the free layer FL may be magnetized. For example, the free layer FL may be magnetized in the same direction as the magnetization direction of the fixed layer PL.

For example, if a current flows from the fixed layer PL to the free layer FL, electrons may flow from the free layer FL to the fixed layer PL. Some of the electrons injected into the fixed layer PL may be reflected from the fixed layer PL to the free layer FL and may rotate due to the magnetization direction of the fixed layer PL. The reflected electrons may rotate in a direction opposite to the magnetization direction of the fixed layer PL. Due to the rotation of the electrons, the free layer FL may be magnetized. For example, the free layer FL may be magnetized in the direction opposite to the magnetization direction of the fixed layer PL.

A variable resistance element VR' may include a fixed layer PL', a free layer FL', and a tunnel layer TL'. The variable resistance element VR', unlike the variable resistance element VR, may have a vertical magnetization direction.

Figure 17:
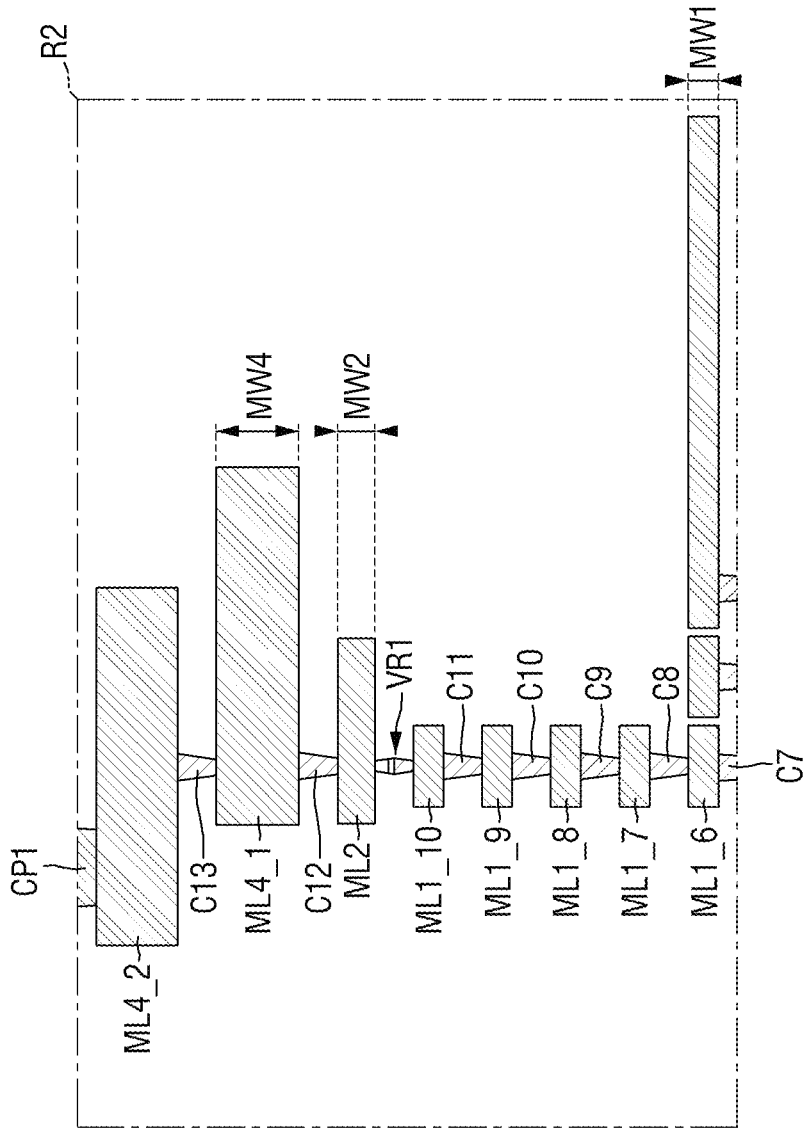
FIG. 17 is an enlarged cross-sectional view of a region R2 of FIG. 6.

FIG. 17 is an enlarged cross-sectional view of a region R2 of FIG. 6.

Referring to FIG. 17, first metal layers ML1_6 through ML1_10, a second metal layer ML2, and fourth metal layers ML4_1 and ML4_2 may be disposed in the inter-wire insulating layer 330. The first metal layers ML1_6 through ML1_10, the second metal layer ML2, and the fourth metal layers ML4_1 and ML4_2 may be sequentially stacked from the bottom of the inter-wire insulating layer 330. Although four (4) metal layers ML1_6 to ML1_10 are illustrated in the figures, example embodiments are not limited thereto, and there may be more than four metal layers, or less than four metal layers in the inter-wire insulating layer 330.

The first metal layers ML1_6 through ML1_10 may have a first thickness MW1, the second metal layer ML2 may have a second thickness MW2, and the fourth metal layers ML4_1 and ML4_2 may have a fourth thickness MW4.

The second thickness MW2 may be greater than the first thickness MW1, and the fourth thickness MW4 may be greater than the second thickness MW2. For example, the second thickness MW2 may be two times the first thickness MW1. For example, the fourth thickness MW4 may be four times the second thickness MW2. The thicknesses of the first metal layers ML1_6 through ML1_10, the second metal layer ML2, and the fourth metal layers ML4_1 and ML4_2 may gradually increase away from the semiconductor substrate 320. However, inventive concepts are not limited to this. The first metal layers ML1_6 through ML1_10, the second metal layer ML2, and the fourth metal layers ML4_1 and ML4_2 may have different thicknesses or the same thickness.

As mentioned above, a variable resistance element VR1 and a contact BEC1 may be disposed between the first metal layer ML1_10 and the second metal layer ML2. For example, the variable resistance element VR1 may be formed between the first metal layer ML1_10, which has the first thickness MW1, and the second metal layer ML2, which has the second thickness MW2.

Figure 18:
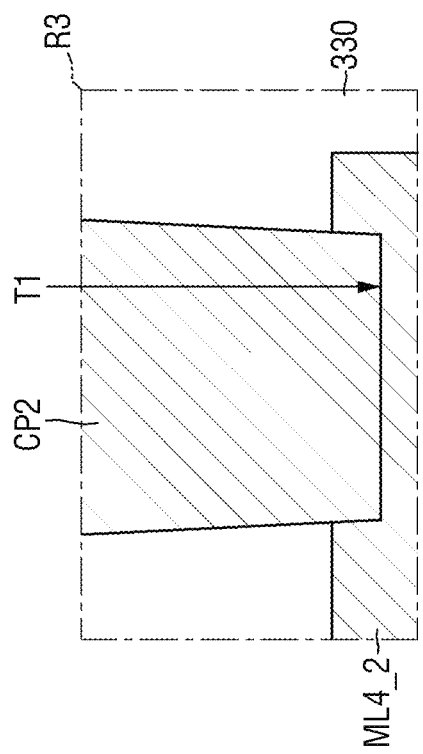
FIG. 18 is an enlarged cross-sectional view of a region R3 of FIG. 6.

FIG. 18 is an enlarged cross-sectional view of a region R3 of FIG. 6.

Referring to FIG. 18, a second contact plug CP2 may be connected to a fourth metal layer ML4_2 of the lower chip 300. The second contact plug CP2 may be landed in a first trench T1 of the fourth metal layer ML4_2. When the inter-wire insulating layer 330 is being etched, the fourth metal layer ML4_2 may also be etched so that the first trench T1 may be formed. The second contact plug CP2 may be formed to fill the first trench T1.

Figure 19:
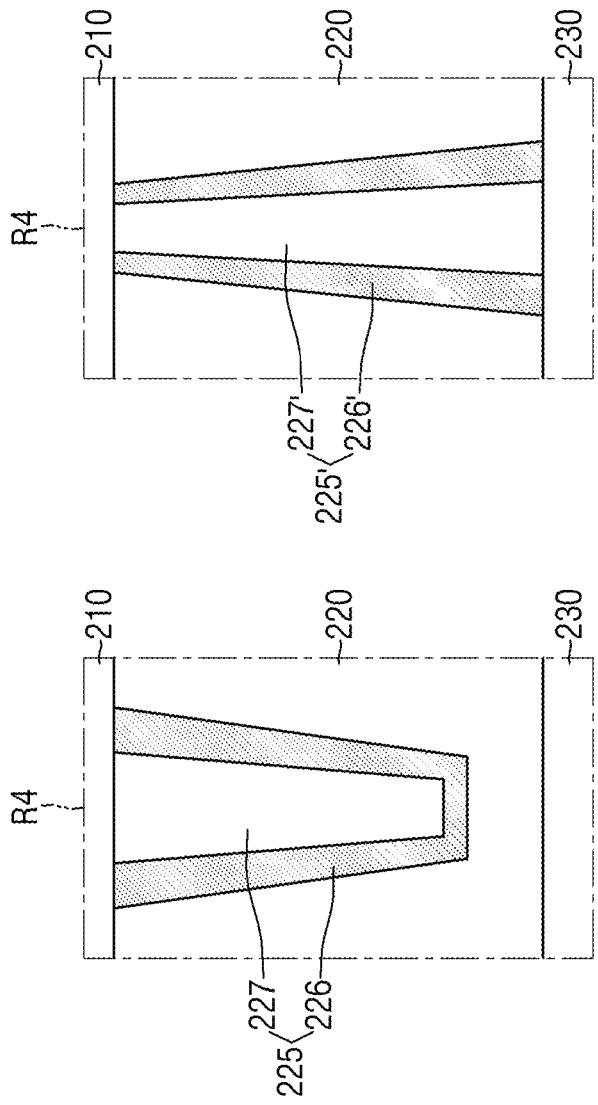
FIG. 19 illustrates enlarged cross-sectional views of a region R4 of FIG. 6.

FIG. 19 illustrates enlarged cross-sectional views of a region R4 of FIG. 6.

Referring to FIG. 19, a pixel separation pattern 225 may be formed on the rear surface of the semiconductor substrate 220. For example, the pixel separation pattern 225 may be formed by forming a trench at the rear surface of the semiconductor substrate 220, forming an insulating spacer film 226 in the trench, and forming a conductive filling pattern 227 on the insulating spacer film 226 to fill the space defined by the insulating spacer film 226. The pixel separation pattern 225 may not be in contact with the front surface of the semiconductor substrate 220. The pixel separation pattern 225 may be or include a backside deep trench isolation (BDTI).

A pixel separation pattern 225' may be formed on the rear surface of the semiconductor substrate 220. Specifically, a trench may be formed at the front surface of the semiconductor substrate 220 to penetrate the semiconductor substrate 220. Thereafter, an insulating spacer film 226' may be formed in the trench, and a conductive filling pattern 227' may be formed on the insulating spacer film 226' to fill the space defined by the insulating spacer film 226'. In this manner, the pixel separation pattern 225' may be obtained. The pixel separation pattern 225' may be or may include a frontside deep trench isolation (FDTI).

An image sensor according to some example embodiments of inventive concepts will hereinafter be described with reference to FIGS. 20 through 23.

Figure 20:
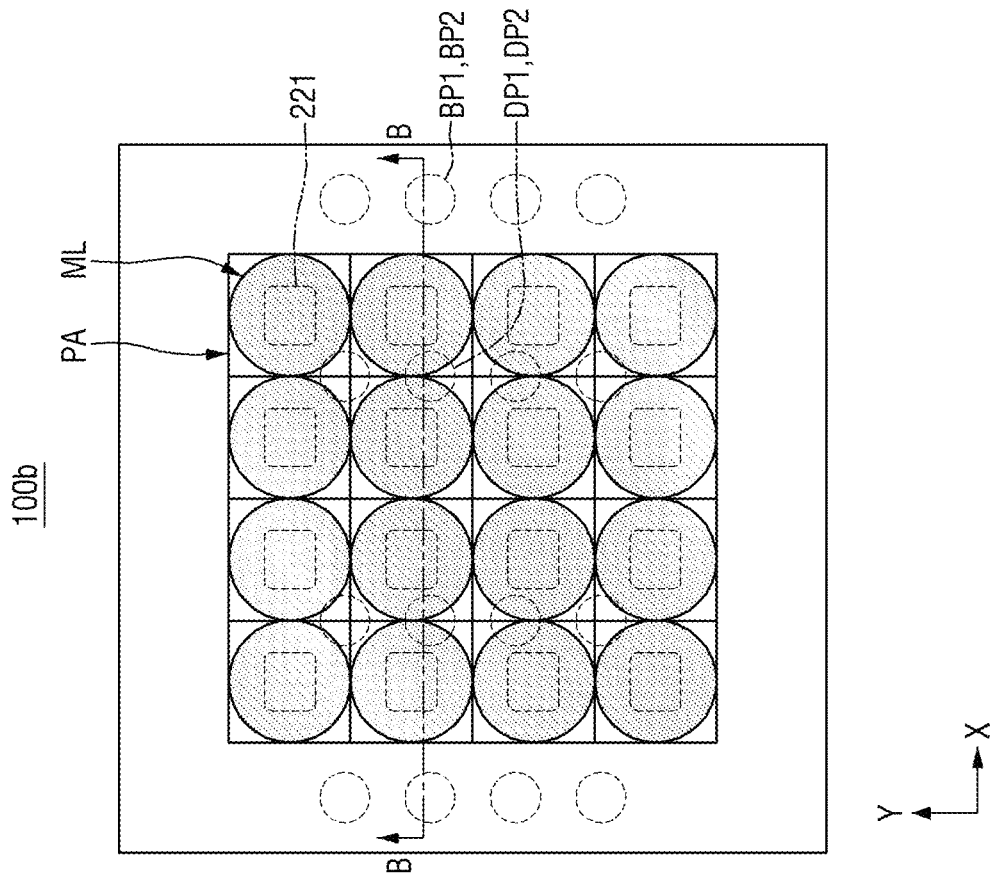
FIG. 20 is a top view of an image sensor 100b according to some example embodiments of inventive concepts.
Figure 21:
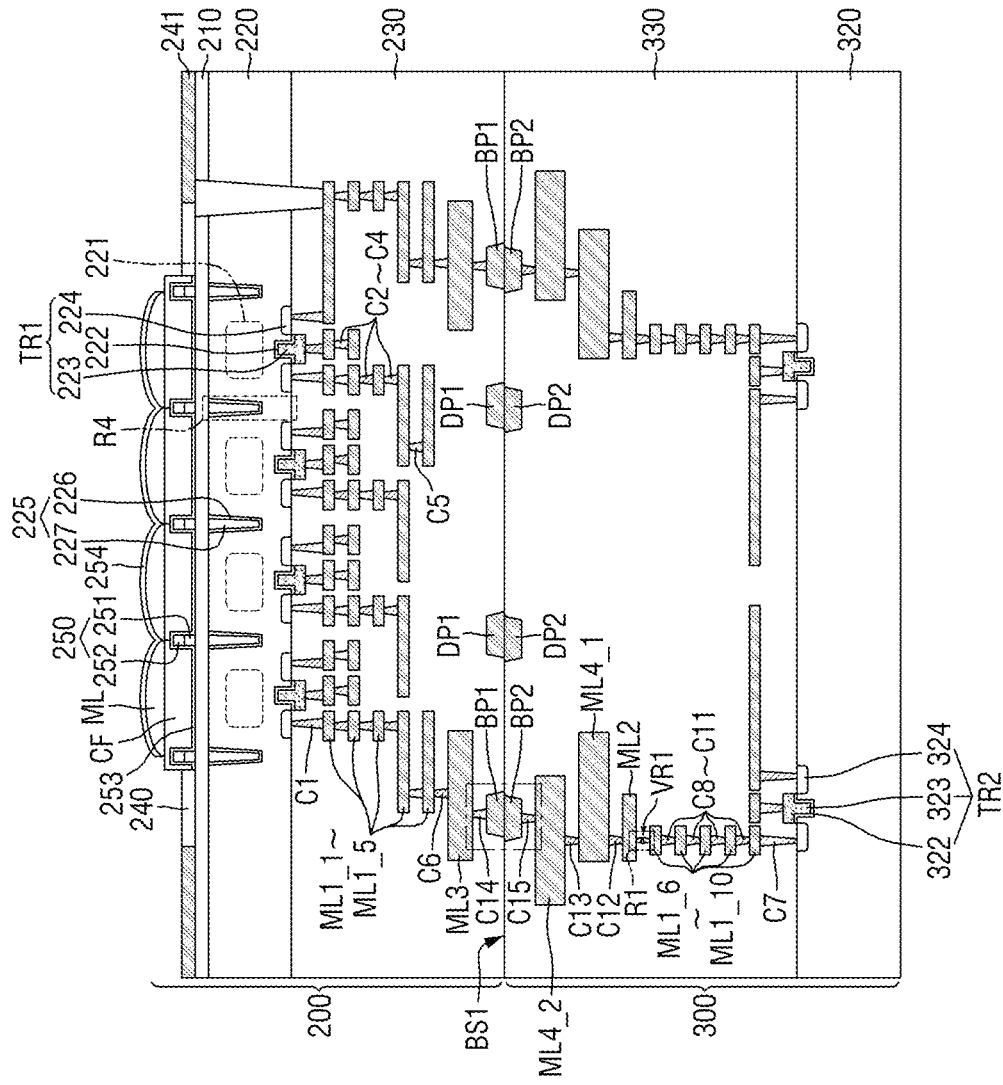
FIG. 21 is a cross-sectional view taken along line B-B of FIG. 20.

FIG. 20 is a top view of an image sensor 100b according to some example embodiments of inventive concepts. FIG. 21 is a cross-sectional view taken along line B-B of FIG. 20. For convenience, descriptions of elements or features that have already been described with reference to FIGS. 1 through 19 will be simplified or omitted.

Referring to FIGS. 20 and 21, an upper chip 200 may include first bonding pads BP1 and first dummy pads DP1, and a lower chip 300 may include second bonding pads BP2 and second dummy pads DP2. The image sensor 100b, unlike the image sensor 100 or 100a, may not include first contact plugs CP1 and second contact plugs CP2.

The first bonding pads BP1 may be connected to third metal layers ML3 via contacts C14. For example, the first bonding pads BP1 may be electrically connected to first transistors TR1 via first metal layers (ML1_1 through ML1_5) and the third metal layers ML3. The second bonding pads BP2 may be connected to fourth metal layers ML4_2 via contacts C15. For example, the second bonding pads BP2 may be electrically connected to second transistors TR2 via first metal layers (ML1_6 through ML1_10), second metal layers ML2, and fourth metal layers (ML4_1 and ML4_2). The first bonding pads BP1 may be exposed at the top surface of an inter-wire insulating layer 230, and the second bonding pads BP2 may be exposed at the top surface of an inter-wire insulating layer 330.

The first dummy pads DP1 and the second dummy pads DP2 may not be connected to metal layers. For example, the first dummy pads DP1 and the second dummy pads DP2 may be disposed on the top surface of the inter-wire insulating layer 230 or 330 and/or may be floating, e.g. electrically floating.

The first bonding pads BP1 and the second bonding pads BP2 may be connected to be in contact with one another, and the first dummy pads DP1 and the second dummy pads DP2 may be connected to be in contact with one another. Signals may be transmitted through the first bonding pads BP1 and the second bonding pads BP2, but the first dummy pads DP1 and the second dummy pads DP2 simply bond the upper chip 200 and the lower chip 300 together and do not transmit signals. However, inventive concepts are not limited to this. Alternatively, the first dummy pads DP1 may be connected to the first metal layers (ML1_1 through ML1_5) or the third metal layers ML3 of the upper chip 200, and the second dummy pads DP2 may be connected to the first metal layers (ML1_6 through ML1_10 or the fourth metal layers (ML4_1 and ML4_2) of the lower chip 300. For example, electrical signals can be transmitted via the first dummy pads DP1 and the second dummy pads DP2.

As the first bonding pads BP1 and the second bonding pads BP2 are bonded together and the first dummy pads DP1 and the second dummy pads DP2 are bonded together, the upper chip 200 and the lower chip 300 may be fixed together.

The upper chip 200 may include third contact plugs CP3. The third contact plugs CP3 may extend from the top surface of the upper chip 200 to first metal layers ML1_1. Pads 241 may be disposed on the third contact plugs CP3. Electrical signals may be transmitted via the third contact plugs CP3.

Figure 22:
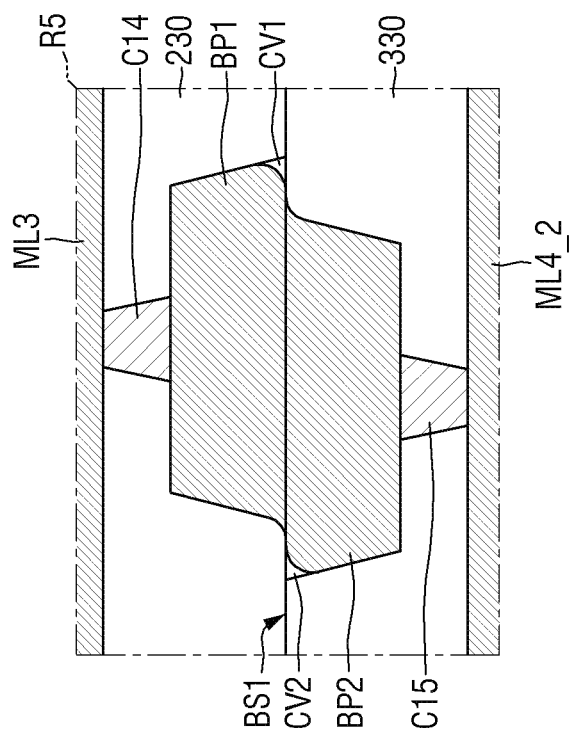
FIGS. 22 and 23 are enlarged cross-sectional views of a region R5 of FIG. 21.
Figure 23:
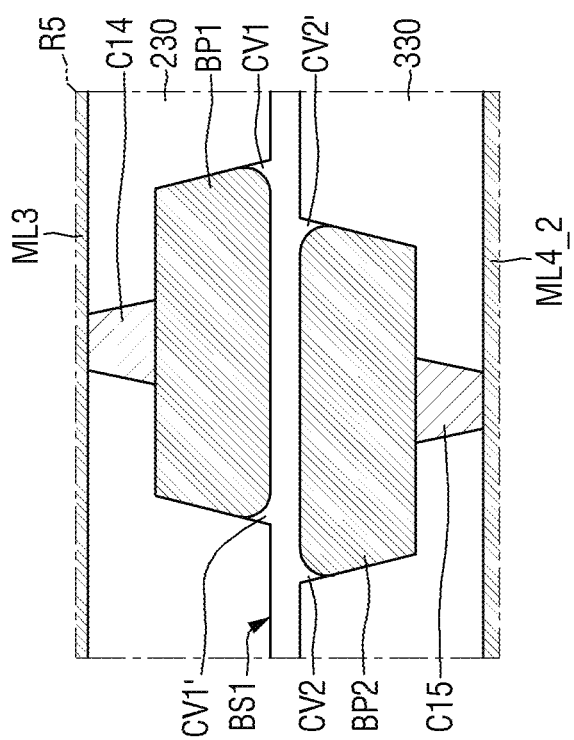

FIGS. 22 and 23 are enlarged cross-sectional views of a region R5 of FIG. 21.

Referring to FIG. 22, first and second bonding pads BP1 and BP2 may be in contact with each other in a staggered manner. For example, part of the first bonding pad BP1 may be in contact with the second bonding pad BP2, but another part of the first bonding pad BP1 may be in contact with the inter-wire insulating layer 330. For example, part of the second bonding pad BP2 may be in contact with the first bonding pad BP1, but another part of the second bonding pad BP2 may be in contact with the inter-wire insulating layer 230.

A first cavity CV1 may be formed between the first bonding pad BP1 and the inter-wire insulating layer 230. For example, the first cavity CV1 may refer to an empty space surrounded by the first bonding pad BP1, the inter-wire insulating layer 230, and the inter-wire insulating layer 330. An empty space surrounded by the second bonding pad BP2, the inter-wire insulating layer 230, and the inter-wire insulating layer 330 may be a second cavity CV2. However, inventive concepts are not limited to this. For example, the first and second cavities CV1 and CV2 may not be formed.

Referring to FIG. 23, when the upper chip 200 and the lower chip 300 are yet to be bonded together, the upper chip 200 may include first cavities CV1 and CV1', and the lower chip 300 may include second cavities CV2 and CV2'. As the upper chip 200 and the lower chip 300 are yet to be bonded together, the diffusion of metallic materials may occur so that the first and second cavities CV1' and CV2' may be removed. However, the diffusion of metallic materials may not occur in the first and second cavities CV1 and CV2 so that the first and second cavities CV1 and CV2 may remain unremoved.

Referring again to FIG. 20, the first bonding pads BP1, the second bonding pads BP2, the first dummy pads DP1, and the second dummy pads DP2 may be arranged almost at any locations in the image sensor 100b. For example, the first bonding pads BP1, the second bonding pads BP2, the first dummy pads DP1, and the second dummy pads DP2 may be arranged even in a region where a pixel array PA is disposed, whereas the first contact plugs CP1 and the second contact plugs CP2 of FIG. 5 are disposed only in the region where the pixel array PA is not disposed.

An image sensor according to some example embodiments of inventive concepts will hereinafter be described with reference to FIGS. 24 through 29.

Figure 24:
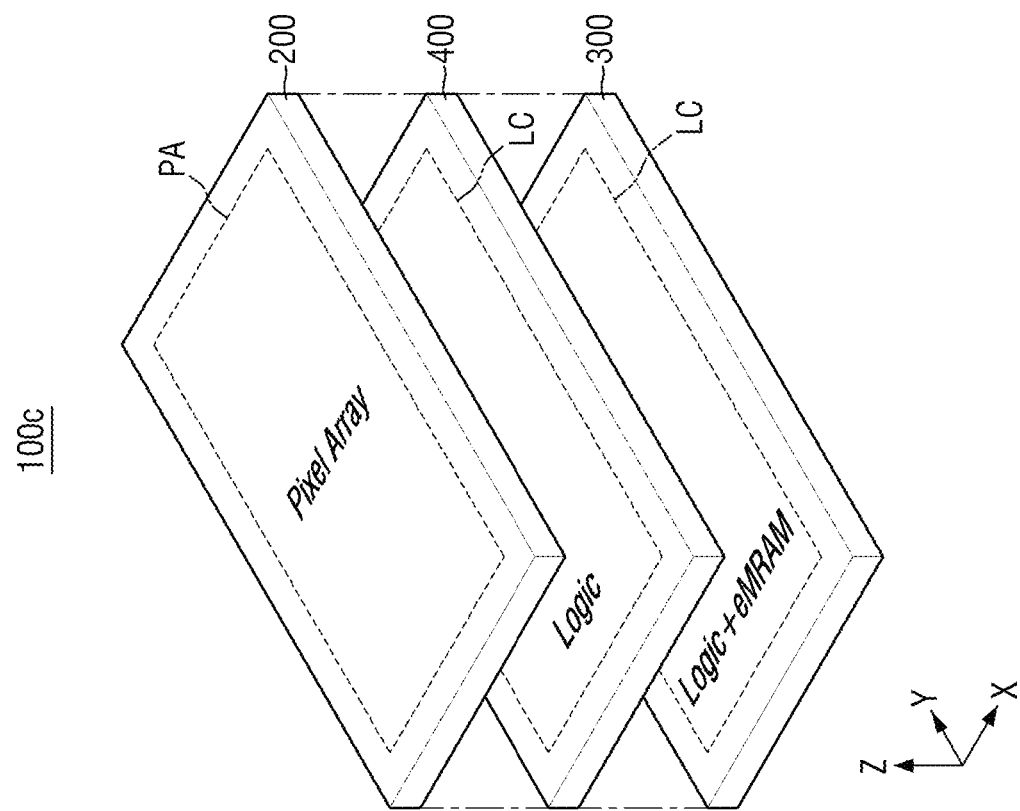
FIG. 24 is a conceptual layout view of an image sensor 100c according to some example embodiments of inventive concepts.
Figure 25:
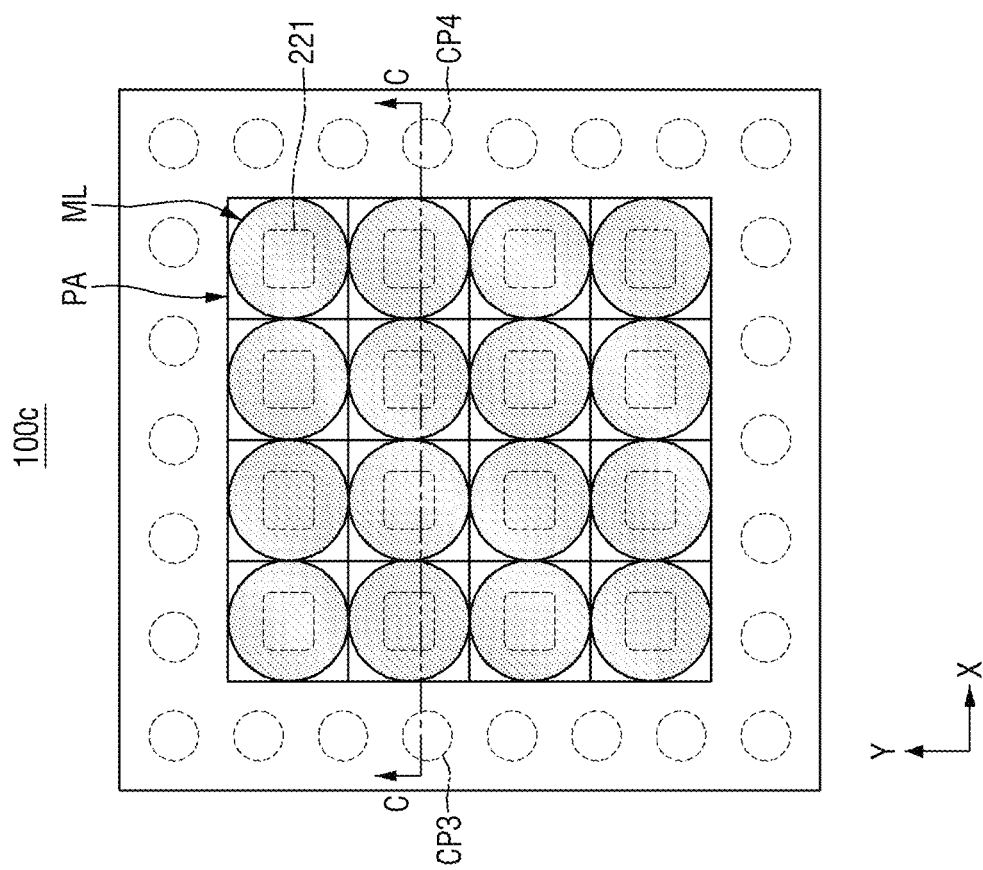
FIG. 25 is a top view of the image sensor 100c of FIG. 24.
Figure 26:
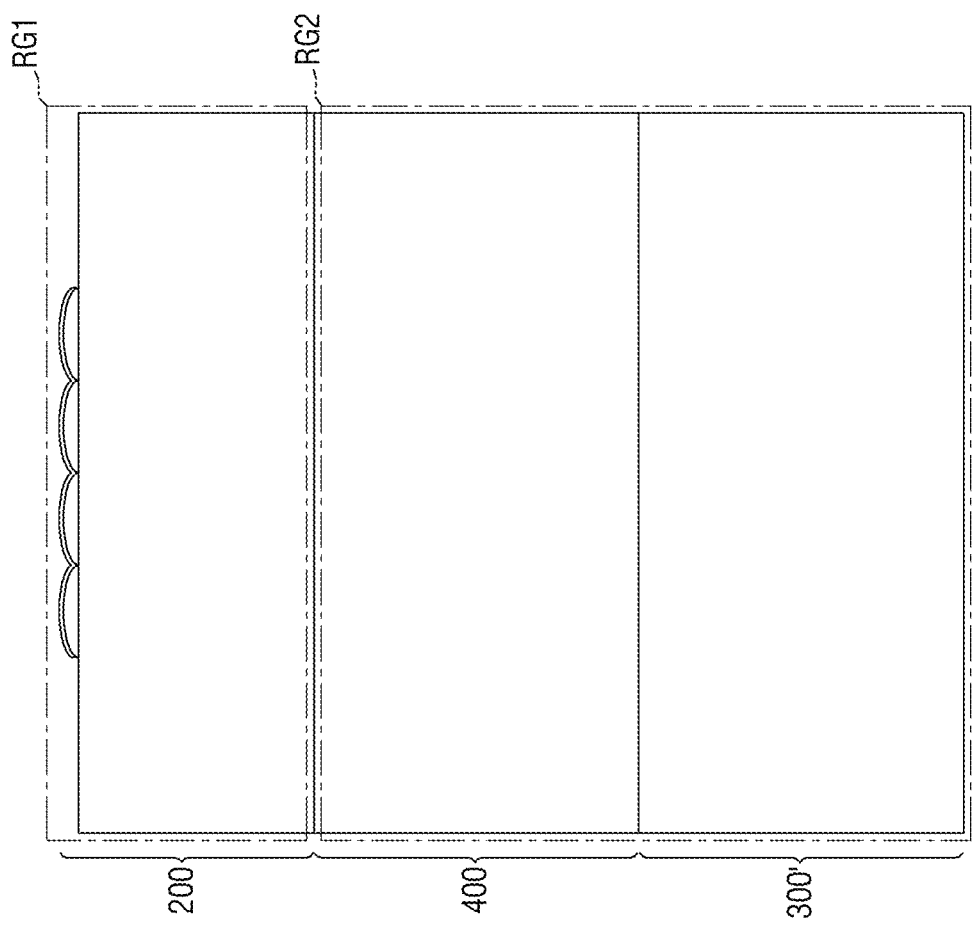
FIG. 26 is a cross-sectional view taken along line C-C of FIG. 25.
Figure 27:
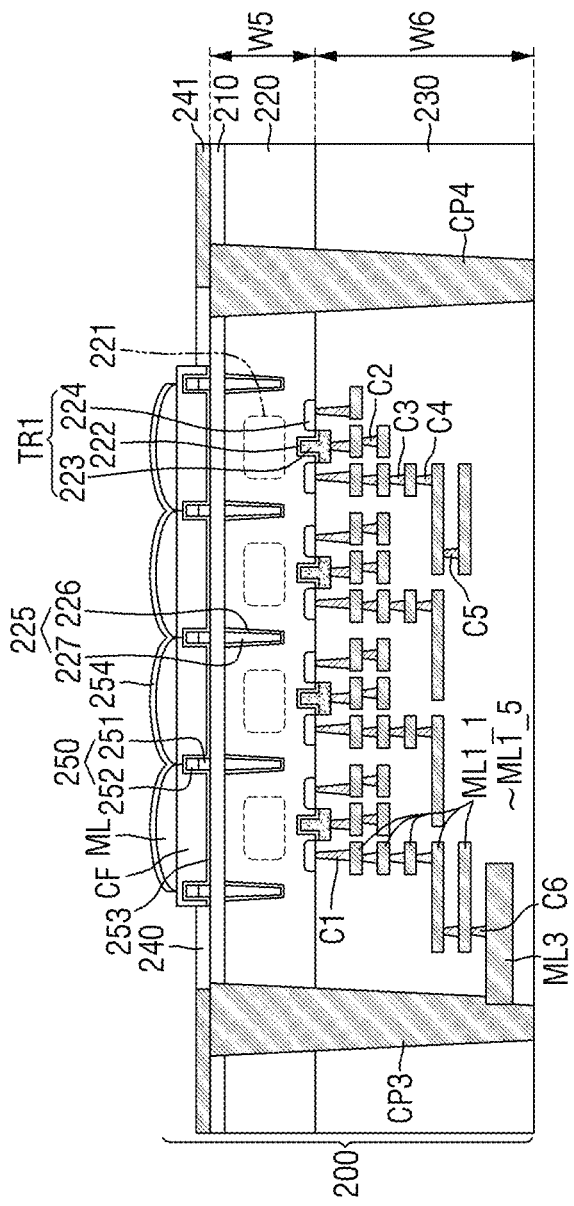
FIG. 27 is an enlarged cross-sectional view of a region RG1 of FIG. 26.
Figure 28:
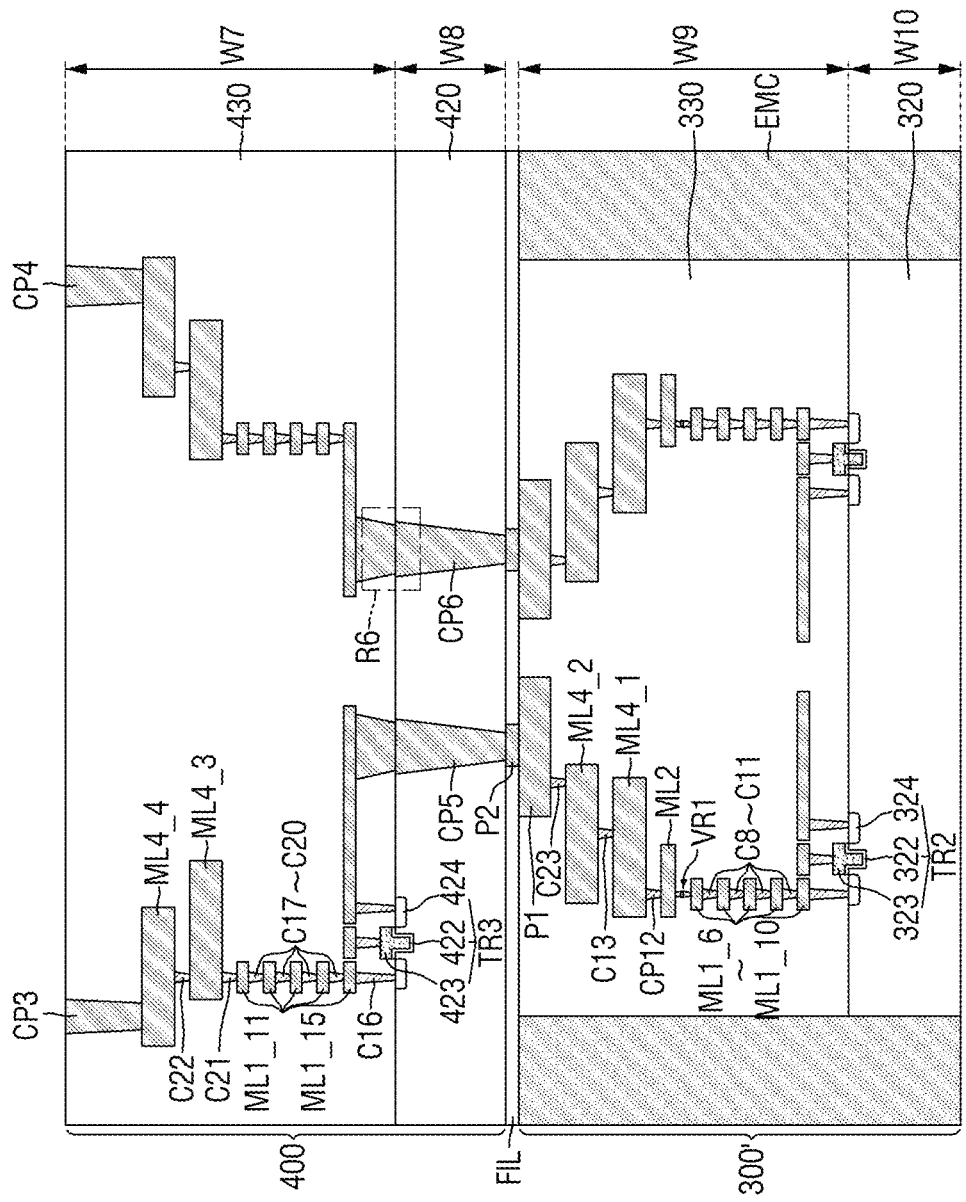
FIG. 28 is an enlarged cross-sectional view of a region RG2 of FIG. 28.
Figure 29:
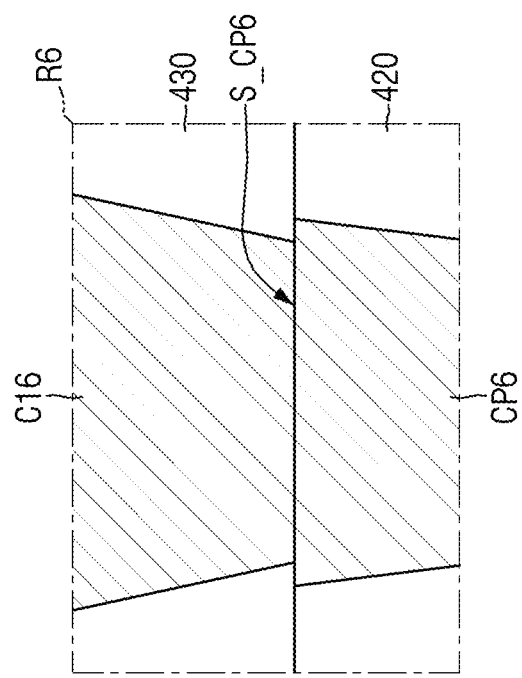
FIG. 29 is an enlarged cross-sectional view of a region R6 of FIG. 28.

FIG. 24 is a conceptual layout view of an image sensor 100c according to some example embodiments of inventive concepts. FIG. 25 is a top view of the image sensor 100c of FIG. 24. FIG. 26 is a cross-sectional view taken along line C-C of FIG. 25. FIG. 27 is an enlarged cross-sectional view of a region RG1 of FIG. 26. FIG. 28 is an enlarged cross-sectional view of a region RG2 of FIG. 28. FIG. 29 is an enlarged cross-sectional view of a region R6 of FIG. 28. For convenience, descriptions of elements or features that have already been described with reference to FIGS. 24 through 29 will be simplified or omitted.

Referring to FIG. 24, the image sensor 100c may include an upper chip 200, a middle chip 400, and a lower chip 300. The middle chip 400 may be stacked on the lower chip 300, and the upper chip 200 may be stacked on the middle chip 400. The upper chip 200 and the lower chip 300 may have the same structures as their respective counterparts of FIGS. 1 through 19. The middle chip 400 may be disposed between the upper chip 200 and the lower chip 300. The middle chip 400 may include logic elements, e.g. logic gates, of the image sensor 100c.

Referring to FIGS. 25 through 28, the upper chip 200, the middle chip 400, and a lower chip 300' may be sequentially stacked.

The lower chip 300' may include a molding film EMC. The molding film EMC may extend along the sidewalls of a semiconductor substrate 320 and the sidewalls of an inter-wire insulating layer 330. For example, the molding film EMC may surround the semiconductor substrate 320 and the inter-wire insulating layer 330. However, the molding film EMC may not cover the top surface of the inter-wire insulating layer 330. The molding film EMC may protect the lower chip 300' from external interference and shock.

The lower chip 300' may pads (P1 and pads P2). Pads P1 may be disposed in the inter-wire insulating layer 330. The pads P1 may be connected to fourth metal layers ML4_2 via contacts C23. The top surfaces of the pads P1 may be exposed at the top surface of the inter-wire insulating layer 330. Pads P2 may be formed on the top surfaces of the pads P1. The pads (P1 and P2) may be connected to metal layers and may thus be able to transmit or receive electrical signals.

The lower chip 300' may also include variable resistance elements VR1. The variable resistance elements VR1 may be disposed between first metal layers ML1_10 and second metal layers ML2.

The middle chip 400 may include a semiconductor substrate 420, third transistors TR3, fifth contact plugs CP5, and sixth contact plugs CP6.

The third transistors TR3 may be formed on the semiconductor substrate 420, but inventive concepts are not limited thereto. Alternatively, only parts of the third transistors TR3 may be formed on the semiconductor substrate 420, and other parts of the third transistors TR3 may be recessed in the semiconductor substrate 420. The third transistors TR3 may include gate insulating films 422, gate electrodes 423, and impurity-injected areas 424.

The fifth contact plugs CP5 and the sixth contact plugs CP6 may be formed in the semiconductor substrate 420. The fifth contact plugs CP5 and the sixth contact plugs CP6 may penetrate the semiconductor substrate 420. For example, the fifth contact plugs CP5 and the sixth contact plugs CP6 may be exposed at the top and the bottom of the semiconductor substrate 420. The fifth contact plugs CP5 and the sixth contact plugs CP6 may be formed during the formation of the third transistors TR3. However, inventive concepts are not limited to this.

The fifth contact plugs CP5 and the sixth contact plugs CP6 may be bonded to the pads P2 of the lower chip 300'. Additionally, the fifth contact plugs CP5 and the sixth contact plugs CP6 may be electrically connected to the pads P2. The fifth contact plugs CP5 and the sixth contact plugs CP6 may transmit or receive electrical signals.

A filler FIL may be formed between the middle chip 400 and the lower chip 300'. That is, the filler FIL may fill the space between the middle chip 400 and the lower chip 300'. The filler FIL may protect the pads P2 from the outside and may improve the adhesion between the middle chip 400 and the lower chip 300'.

The middle chip 400 may include an inter-wire insulating layer 430, first metal layers (ML1_11 through ML1_15), fourth metal layers (ML4_3 and ML4_4), and contacts (C16, 17 through 20, C21, and C22). The inter-wire insulating layer 430 may be formed on the semiconductor substrate 420. The first metal layers (ML1_11 through ML1_15) and the fourth metal layers (ML4_3 and ML4_4) may be sequentially formed in the inter-wire insulating layer 430. The first metal layers (ML1_11 through ML1_15) and the fourth metal layers (ML4_3 and ML4_4) may be connected by the contacts (C16, 17 through 20, C21, and C22).

Third contact plugs CP3 and fourth contact plugs CP4 may extend from the top surface of the upper chip 200 and may be connected to fourth metal layers ML4_4. The third contact plugs CP3 and the fourth contact plugs CP4 may transmit or receive electrical signals.

Referring to FIG. 29, a contact C16 may be formed on a sixth contact plug CP6. The contact C16 may be formed by etching the inter-wire insulating layer 430 to form a trench and filling the trench with a conductive material. Accordingly, the sixth contact plug CP6 may not be etched during the etching of the inter-wire insulating layer 430. That is, the surfaces of the contact C16 and the sixth contact plug CP6 that are in contact with each other may not be etched. For example, a top surface S_CP6 of the sixth contact plug CP6 may not be etched.

Referring to FIGS. 27 and 28, a semiconductor substrate 220 may have a fifth thickness W5, and an inter-wire insulating layer 230 may have a sixth thickness W6. The semiconductor substrate 420 may have an eighth thickness W8, and the inter-wire insulating layer 430 may have a seventh thickness W7. The semiconductor substrate 320 may have a tenth thickness W10, and the inter-wire insulating layer 330 may have a ninth thickness W9.

The sixth thickness W6 may be greater than the fifth thickness W5. The seventh thickness W7 may be greater than the sixth thickness W6. The eighth thickness W8 may be greater than the sum of the fifth, sixth, and seventh thicknesses W5, W6, and W7. The tenth thickness W10 may be greater than the ninth thickness W9. However, inventive concepts are not limited to this.

An image sensor according to some example embodiments of inventive concepts will hereinafter be described with reference to FIGS. 30 through 32.

Figure 30:
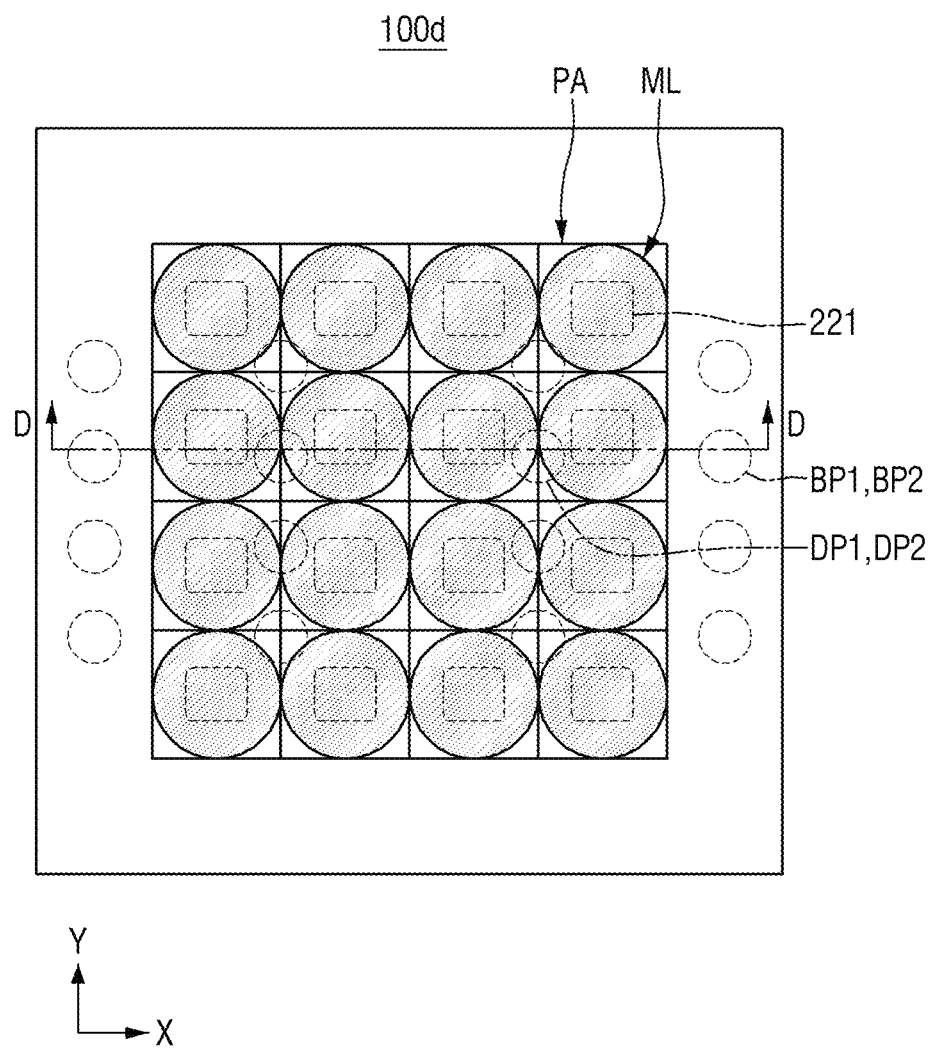
FIG. 30 is a top view of an image sensor 100d according to some example embodiments of inventive concepts.

FIG. 30 is a top view of an image sensor 100d according to some example embodiments of inventive concepts. FIG. 31 is a cross-sectional view taken along line D-D of FIG. 30. FIG. 32 is an enlarged cross-sectional view of a region RG3 of FIG. 31. For convenience, descriptions of elements or features that have already been described with reference to FIGS. 30 through 32 will be simplified or omitted.

Figure 31:
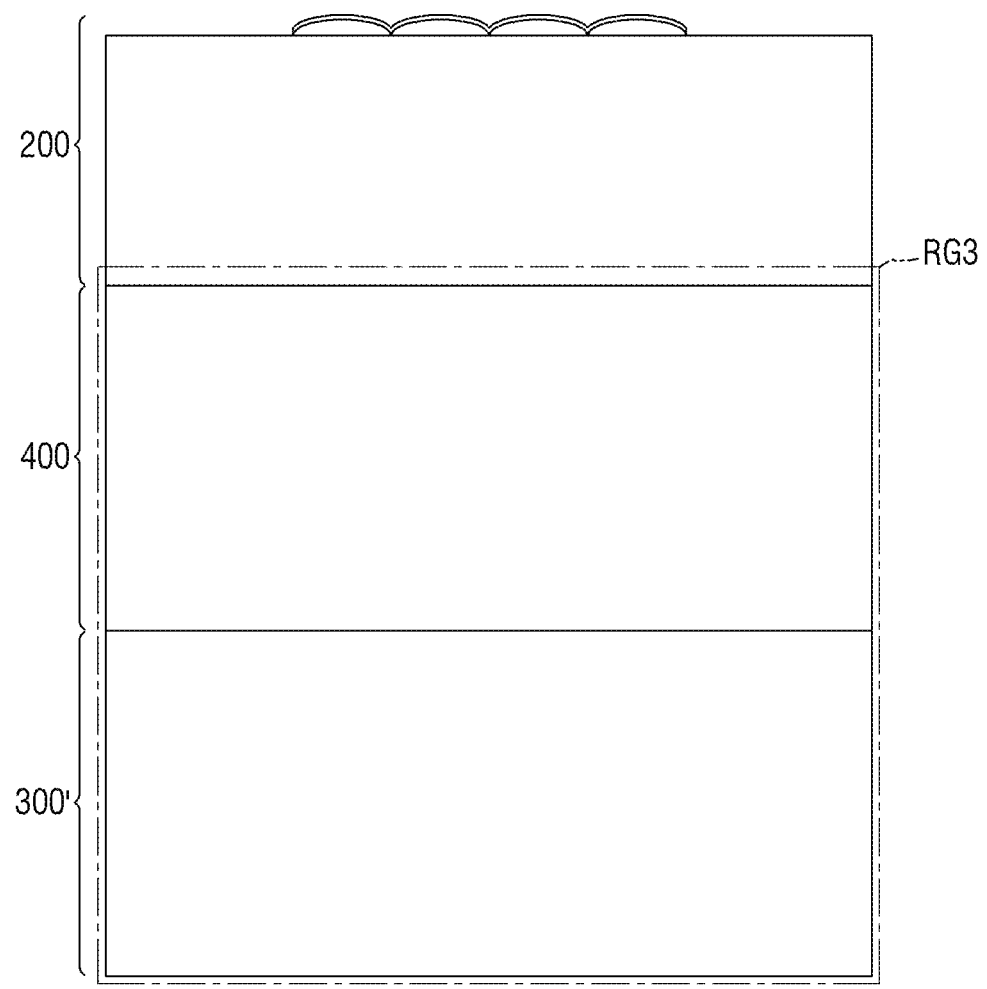
FIG. 31 is a cross-sectional view taken along line D-D of FIG. 30.
Figure 32:
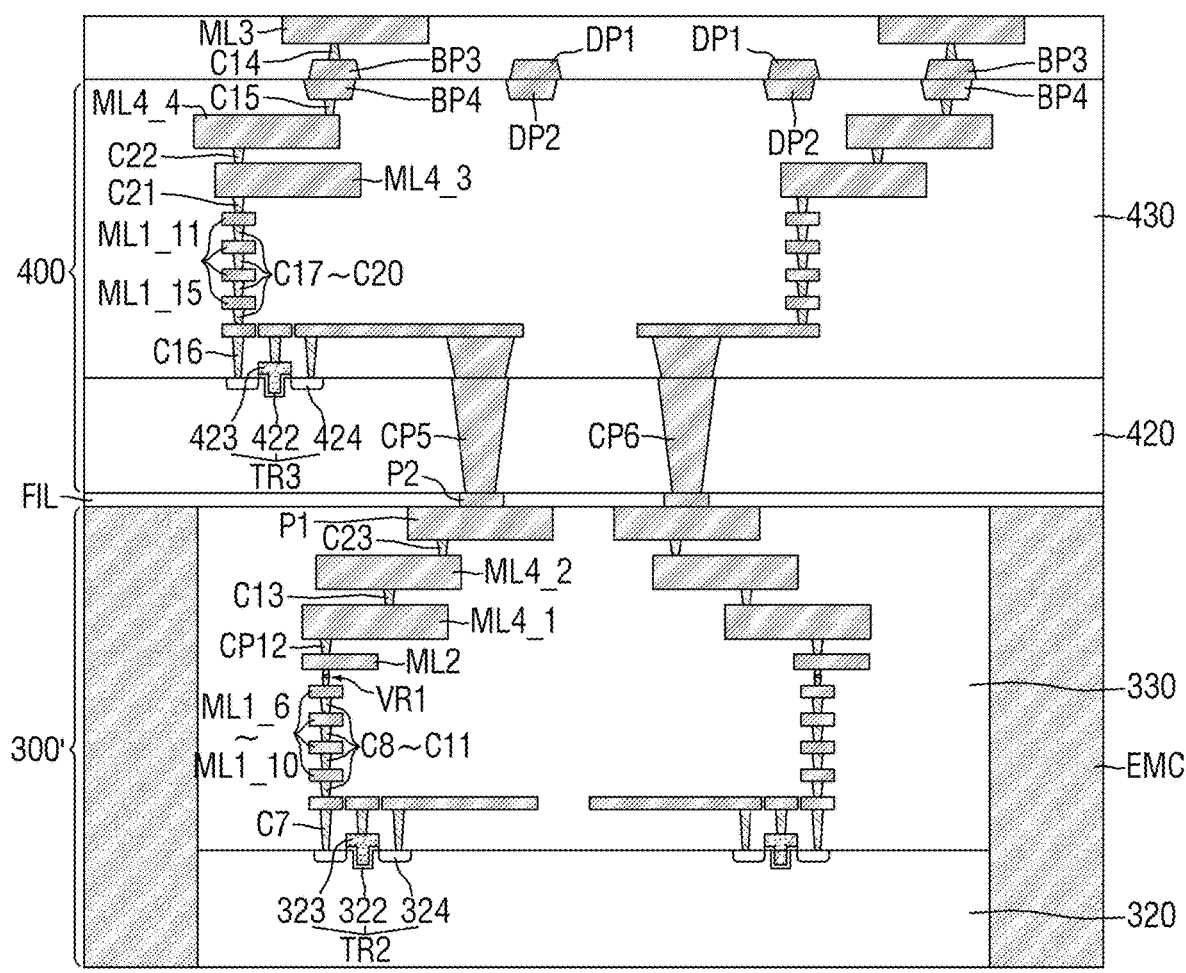
FIG. 32 is an enlarged cross-sectional view of a region RG3 of FIG. 31.

Referring to FIGS. 30 through 32, the image sensor 100d may include a lower chip 300, a middle chip 400, and an upper chip 200, which are sequentially stacked.

The upper chip 200 may include third bonding pads BP3 and first dummy pads DP1. The middle chip 400 may include fourth bonding pads BP4 and second dummy pads DP2. The third bonding pads BP3 may be connected to third metal layers ML3 via contacts C14, and the fourth bonding pads BP4 may be connected to fourth metal layers ML4_4 via contacts C15. The third bonding pads BP3 and the first dummy pads DP1 may be exposed at the top surface of the upper chip 200, and the fourth bonding pads BP4 and the second dummy pads DP2 may be exposed at the top surface of the middle chip 400.

The third bonding pads BP3 and the fourth bonding pads BP4 may be bonded together, and the first dummy pads DP1 and the second dummy pads DP2 may be bonded together. That is, the upper chip 200 and the middle chip 400 may be connected via the third bonding pads BP3, the fourth bonding pads BP4, the first dummy pads DP1, and the second dummy pads DP2. Also, the middle chip 400 and a lower chip 300' may be connected via pads P2.

The lower chip 300' may include variable resistance elements VR1. As image data can be temporarily stored in the variable resistance elements VR1, the lower chip 300' may perform the functions of a frame image buffer.

An electronic device according to some example embodiments of inventive concepts will hereinafter be described with reference to FIGS. 33 and 34.

Figure 33:
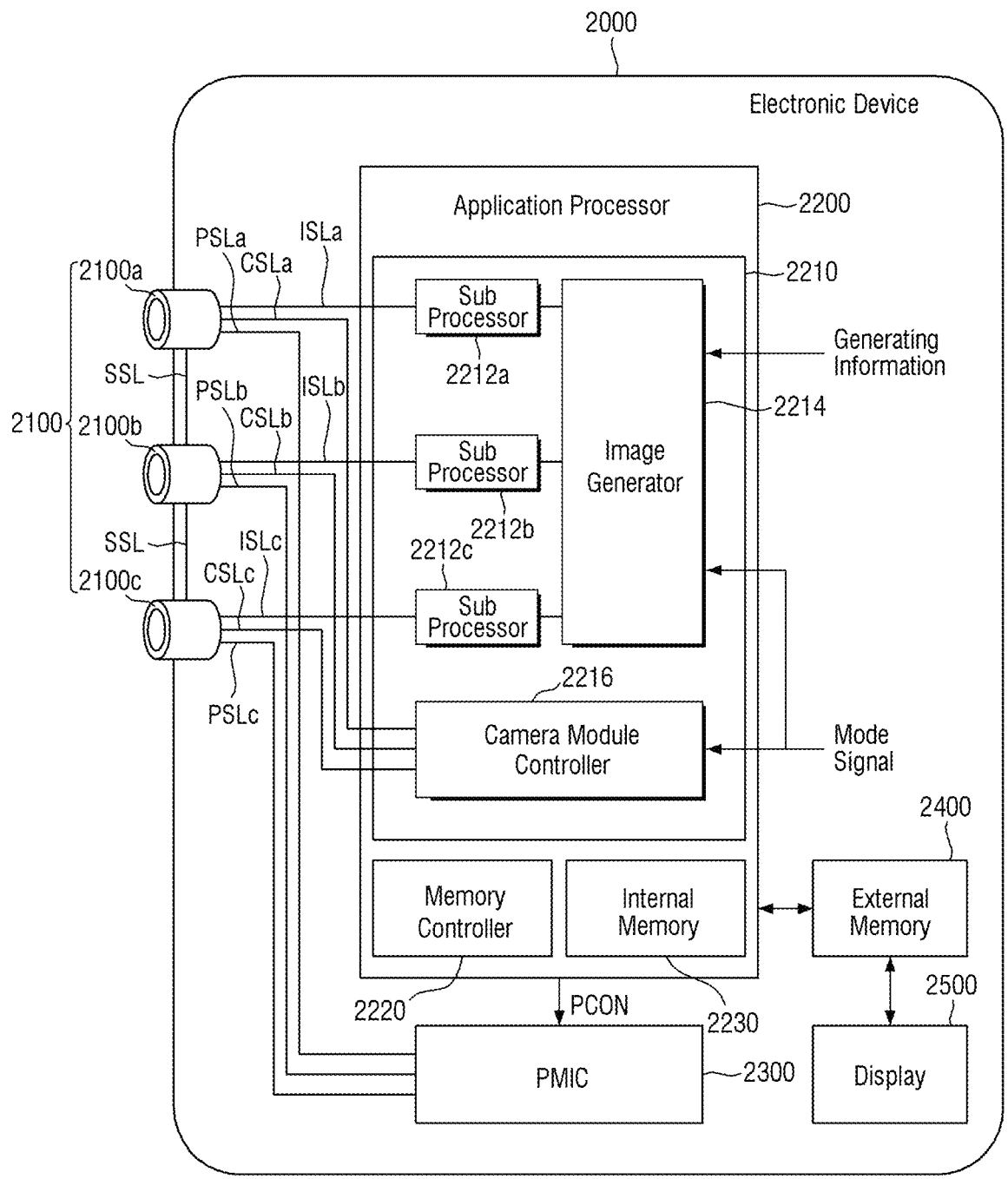
FIG. 33 is a block diagram of an electronic device 2000 according to some example embodiments of inventive concepts.

FIG. 33 is a block diagram of an electronic device 2000 according to some example embodiments of inventive concepts. FIG. 34 is a detailed block diagram of a camera module of FIG. 33. For convenience, descriptions of elements or features that have already been described with reference to FIGS. 1 through 32 will be simplified or omitted.

Referring to FIG. 33, the electronic device 2000 may include a camera module group 2100, an application processor 2200, a power management integrated circuit (PMIC) 2300, an external memory 2400, and a display 2500.

The camera module group 2100 may include a plurality of camera modules 2100a, 2100b, and 2100c. FIG. 33 illustrates that three camera modules are arranged, but inventive concepts are not limited thereto. For example, the camera module group 2100 may be configured to include only two camera modules. For example, the camera module group 2100 may be configured to include n camera modules (where n is a natural number of 4 or greater).

One of the camera modules 2100a, 2100b, and 2100c may be a camera module including any one of the image sensors of FIGS. 1 through 32.

The structure of the camera module 2100b will hereinafter be described with reference to FIG. 34. The following description of the camera module 2100b may be directly applicable to the other camera modules 2100a and 2100c.

Figure 34:
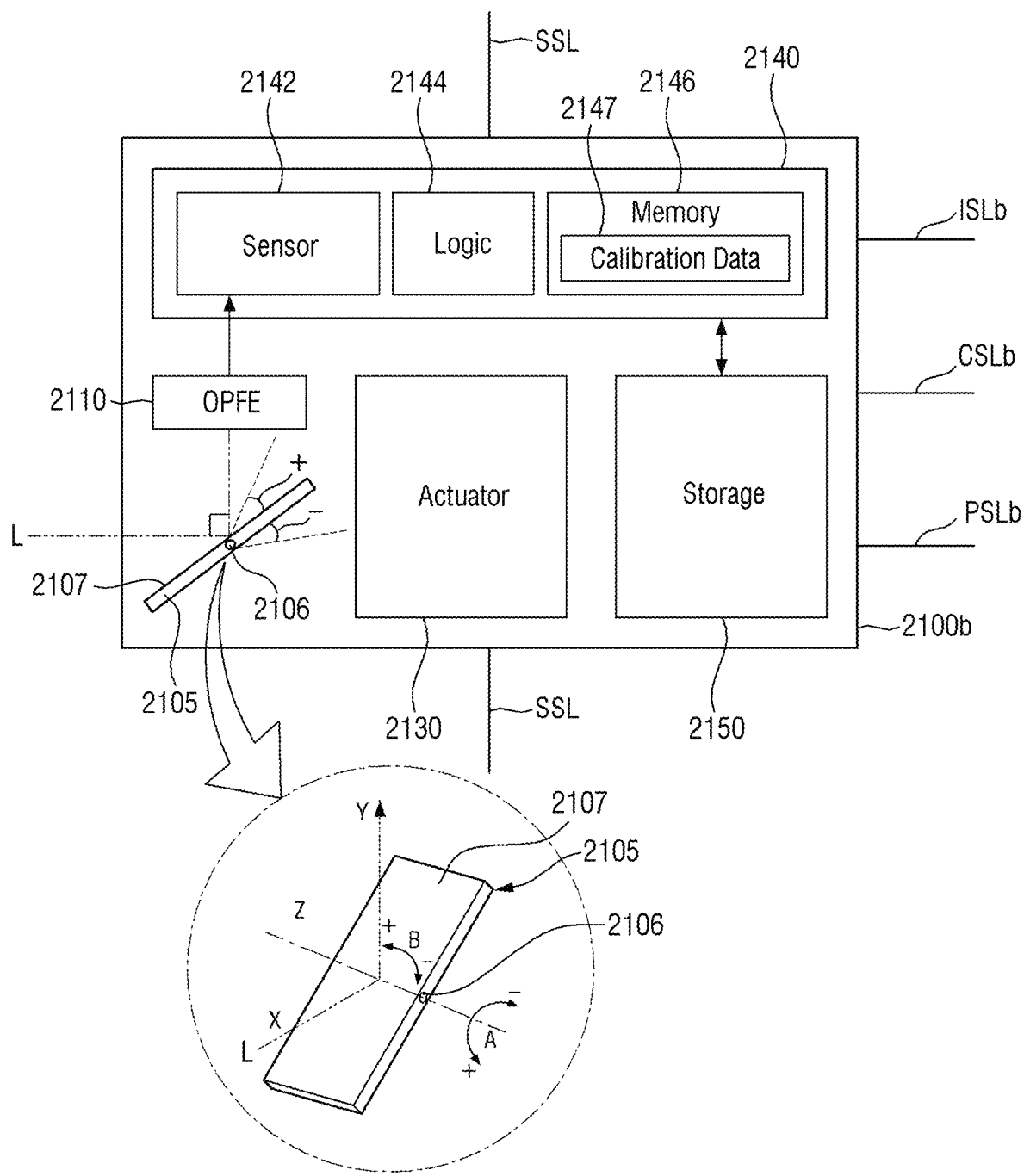
FIG. 34 is a detailed block diagram of a camera module of FIG. 33.

Referring to FIG. 34, the camera module 2100b may include a prism 2105, an optical path folding element (OPFE) 2110, an actuator 2130, an image sensing device 2140, and a storage 2150.

The prism 2105 may include a reflective surface 2107 of a light-reflecting material and may thus change the path of light L incident from the outside.

In some example embodiments, the prism 2105 may change the path of the light L from a first direction X to a second direction Y, which is perpendicular to the first direction X. The prim 2105 may change the path of the light L from the first direction X to the second direction Y by rotating the reflective surface 2107 in an A or B direction about a central axis 2106. In this case, the OPFE 2110 may be moved in a third direction Z, which is perpendicular to the first and second directions X and Y.

In some example embodiments, the maximum rotation angle of the prism 2105 may be 15 degrees or less in a +A direction and may be greater than 15 degrees in a −A direction, but inventive concepts are not limited thereto.

In some example embodiments, the prism 2105 may be moved by about 20 degrees, 10 to 20 degrees, or 15 to 20 degrees in a +B or −B direction. The prism 2105 may be moved by the same angle or similar angles (with a difference of about 1 degree or less) in both the +B and −B direction.

In some example embodiments, the prism 2105 may move the reflective surface 2106 of the light-reflecting material in the third direction Z, which is parallel to the direction in which the central axis 2106 extends.

The OPFE 2110 may include, for example, a group of m optical lenses (where m is a natural number). The m optical lenses may move in the second direction Y to change the optical zoom ratio of the camera module 2100b. For example, when the basic optical zoom ratio of the camera module 2100b is Z, the optical zoom ratio of the camera module 2100b may be changed to 3 Z or 5 Z or greater by moving the m optical lenses of the OPFE 2110.

The actuator 2130 may move the OPFE 2110 or the optical lenses of the OPFE 2110 to a particular location. For example, the actuator 2130 may adjust the location of the optical lenses of the OPFE 2110 such that an image sensor 2142 can be placed at the focal length of the optical lenses of the OPFE 2110.

The image sensing device 2140 may include the image sensor 2142, a control logic 2144, and a memory 2146. The image sensor 2142 may sense an image of a target object using the light L provided thereto via the optical lenses. In some example embodiments, the image sensor 2142 may include the image sensor 100, 100a, 100b, 100c, or 100d.

The control logic 2144 may control the general operation of the camera module 2100b. For example, the control logic 2144 may control the operation of the camera module 2100b in accordance with a control signal provided thereto via a control signal line CSLb.

The memory 2146 may store information necessary for the operation of the camera module 2100b, such as calibration data 2147. The calibration data 2147 may include information necessary for the camera module 2100b to generate image data based on the light L. The calibration data 2147 may include, for example, degree-of-rotation information, focal length information, and optical axis information. In a case where the camera module 2100b is implemented as a multistate camera whose focal length changes depending on the location of optical lengths thereof, the calibration data 2147 may include focal length data for different locations (or states) of optical lenses and auto-focusing information. The memory 2146 may include variable resistance elements VR1. That is, the memory 2146 may include memory cells MC including variable resistance elements VR1.

The storage 2150 may store image data sensed by the image sensor 2142. The storage 2150 may be disposed on the outside of the image sensing device 2140 and may be stacked on or below a sensor chip of the image sensing device 2140. In some example embodiments, the storage 2150 may be implemented as an electrically erasable programmable read-only memory (EEPROM), but inventive concepts are not limited thereto. The storage 2150 may be formed by the lower chip 300 or 300'. The storage 2150 may include memory cells MC including variable resistance elements VR1.

Referring to FIGS. 33 and 34, in some example embodiments, the camera modules 2100a, 2100b, and 2100c may include their own actuator 2130. Accordingly, the camera modules 2100a, 2100b, and 2100c may include the same or different calibration data 2147 depending on the operation of their own actuator 2130.

In some example embodiments, one of the camera modules 2100a, 2100b, and 2100c, for example, the camera module 2100b, may be a folded lens-type camera module including the prism 2105 and the OPFE 2110, and the other camera modules may be vertical camera modules including no prism 2105 and no OPFE 2110. However, inventive concepts are not limited to this.

In some example embodiments, one of the camera modules 2100a, 2100b, and 2100c, for example, the camera module 2100c, may be a vertical depth camera capable of extracting depth information using, for example, infrared (IR) rays. In this case, the application processor 1200 may generate a three-dimensional (3D) depth image by merging image data provided by the camera module 2100c and image data provided by the other camera modules, i.e., the camera modules 2100a and 2100b.

In some example embodiments, at least two of the camera modules 2100a, 2100b, and 2100c, for example, the camera modules 2100a and 2100c, may have different fields of view. In this case, at least two of the camera modules 2100a, 2100b, and 2100c, for example, the camera modules 2100a and 2100c, may have different sets of optical lenses, but inventive concepts are not limited thereto.

In some example embodiments, the camera modules 2100a, 2100b, and 2100c may all have different viewing angles. In this case, the camera modules 2100a, 2100b, and 2100c may all have different sets of optical lenses, but inventive concepts are not limited thereto.

In some example embodiments, the camera modules 2100a, 2100b, and 2100c may be physically separated from one another. For example, the camera modules 2100a, 2100b, and 2100c may have their own image sensor 2142 disposed therein, rather than sharing the sensing area of one image sensor 2142.

Referring again to FIG. 33, the application processor 2200 may include an image processor 2210, a memory controller 2220, and an internal memory 2230. The application processor 2200 may be configured to be separate from the camera modules 2100a, 2100b, and 2100c. For example, the application processor 2200 may be implemented as a separate semiconductor chip from the camera modules 2100a, 2100b, and 2100c.

The image processor 2210 may include a plurality of sub-image processors 2212a, 2212b, and 2212c, an image generator 2214, and a camera module controller 2216.

The image processor 2210 may include as many sub-image processors as there are camera modules.

Image data generated by the camera modules 2100a, 2100b, and 2100c may be provided to the sub-image processors 2212a, 2212b, and 2212c via separate image signal lines ISLa, ISLb, and ISLc. For example, the image data generated by the camera module 2100a may be provided to the sub-image processor 2212a via the image signal line ISLa, the image data generated by the camera module 2100b may be provided to the sub-image processor 2212b via the image signal line ISLb, and the image data generated by the camera module 2100c may be provided to the sub-image processor 2212c via the image signal line ISLc. The image data generated by the camera modules 2100a, 2100b, and 2100c may be transmitted via, for example, a mobile industry processor interface (MIPI)-based camera serial interface (CSI), but inventive concepts are not limited thereto.

In some example embodiments, one sub-image processor may be disposed to correspond to multiple camera modules. For example, the sub-image processors 2212a and 2212c may be incorporated into a single sub-image processor. In this example, one of image data provided by the camera module 2100a and image data provided by the camera module 2100c may be selected by, for example, a multiplexer, and the selected image data may be provided to the single sub-image processor.

The image data provided to each of the sub-image processors 2212a, 2212b, and 2212c may be provided to the image generator 2214. The image generator 2214 may generate an output image based on the image data provided to each of the sub-image processors 2212a, 2212b, and 2212c, in accordance with image generating information or a mode signal.

Specifically, the image generator 2214 may generate an output image by merging at least some of the image data generated by the camera modules 2100a, 2100b, and 2100c, which have different viewing angles. Also, the image generator 2214 may generate an output image by selecting one of the image data generated by the camera modules 2100a, 2100b, and 2100c, which have different viewing angles, in accordance with the image generating information or the mode signal.

In some example embodiments, the image generating information may include a zoom signal (or a zoom factor). In some example embodiments, the mode signal may be, for example, a signal of a mode selected by a user.

If the image generating signal is a zoom signal (or a zoom factor) and the camera modules 2100a, 2100b, and 2100c have different fields of view (or different viewing angles), the image generator 2214 may perform different operations depending on the type of the zoom signal. For example, if the zoom signal is a first signal, image data output by the camera module 2100a and image data output by the camera module 2100c may be merged together, and an output image may be generated using the merged image data and image data output by the camera module 2100b. For example, if the zoom signal is a second signal, which is different from the first signal, the image generator 2214 may generate an output image by selecting one of the image data output by the camera modules 2100a, 2100b, and 2100c, instead of merging the image data output by the camera modules 2100a, 2100b, and 2100c. However, inventive concepts are not limited to this. For example, the method to process image data may vary.

In some example embodiments, the image generator 2214 may receive multiple image data having different exposure durations from at least one of the sub-image processors 2212a, 2212b, and 2212c and may perform high dynamic range (HDR) processing on the multiple image data, thereby generating merged image data with an increased dynamic range.

The camera module controller 2216 may provide control signals to the camera modules 2100a, 2100b, and 2100c. The control signals may be provided from the camera module controller 2216 to the camera modules 2100a, 2100b, and 2100c via separate control signal lines CSLa, CSLb, and CSLc.

In accordance with the image generating information or the mode signal, one of the camera modules 2100a, 2100b, and 2100c, for example, the camera module 2100a, may be designated as a master camera, and the other camera modules, i.e., the camera modules 2100b and 2100c, may be designated as slave cameras. This type of information may be included in a control signal and may thus be provided to the camera modules 2100a, 2100b, and 2100c via the control signal lines CSLa, CSLb, and CSLc.

The master camera and the slave cameras may be changed in accordance with a zoom signal (or a zoom factor) or the mode signal. For example, if the camera module 2100a has a wider field of view than the camera module 2100c and the zoom signal denotes a low zoom ratio, the camera module 2100c may operate as a master camera, and the camera module 2100a may operate as a slave camera. On the contrary, if the zoom signal denotes a high zoom ratio, the camera module 2100a may operate as a master camera, and the camera module 2100c may operate as a slave camera.

In some example embodiments, the control signals provided from the camera module controller 2216 to the camera modules 2100a, 2100b, and 2100c may include a sync enable signal. For example, if the camera module 2100b is a master camera and the camera modules 2100a and 2100c are slave cameras, the camera module controller 2216 may transmit the sync enable signal to the camera module 2100b. Then, the camera module 2100b may generate a sync signal based on the sync enable signal and may provide the sync signal to the camera modules 2100a and 2100c via sync signal lines SSL. As a result, the camera modules 2100a, 2100b, and 2100c may all be synchronized with the sync signal to transmit image data to the application processor 2200.

In some example embodiments, the control signals provided from the camera module controller 2216 to the camera modules 2100a, 2100b, and 2100c may include mode information from the mode signal. The camera modules 2100a, 2100b, and 2100c may operate in first and second operating modes, which are associated with a sensing speed, based on the mode information.

In the first operating mode, the camera modules 2100a, 2100b, and 2100c may generate an image signal at a first speed (e.g., at a first frame rate), may encode the image signal at a second speed higher than the first speed (e.g., at a second frame rate higher than the first frame rate), and may transmit the encoded image signal to the application processor 2200. The second speed may be 30 times or less the first speed.

The application processor 2200 may store a received image signal, i.e., an encoded image signal, in the internal memory 2230 or in the external memory 2400, which is outside the application processor 2200, and may read out and decode the encoded image signal from the internal or external memory 2230 or 2400, and may display image data generated based on the decoded image signal. For example, one of the sub-processors 2212a, 2212b, and 2212c of the image processor 2210 may decode the encoded image signal and may perform image processing on the decoded image signal. For example, the image data generated based on the decoded image signal may be displayed by the display 2500.

In the second operating mode, the camera modules 2100a, 2100b, and 2100c may generate an image signal at a third speed lower than the first speed (e.g., at a third frame rate lower than the first frame rate) and may transmit the encoded image signal to the application processor 2200. The image signal provided to the application processor 2200 may be an unencoded signal. The application processor 2200 may perform image processing on the image signal provided thereto or may store the image signal provided thereto in the internal or external memory 2230 or 2400.

The PMIC 2300 may provide power, for example, power supply voltages, to the camera modules 2100a, 2100b, and 2100c. For example, the PMIC 2300 may provide first power to the camera module 2100a via a power signal line PSLa, second power to the camera module 2100b via a power signal line PSLb, and third power to the camera module 2100c via a power signal line PSLc under the control of the application processor 2200.

The PMIC 2300 may generate power for each of the camera modules 2100a, 2100b, and 2100c in response to a power control signal PCON from the application processor 2200 and may control the level of the power. The power control signal PCON may include a power control signal for different operating modes of the camera modules 2100a, 2100b, and 2100c. For example, the different operating modes may include a lower power mode, and the power control signal PCON may include information indicating which of the camera modules 2100a, 2100b, and 2100c is to operate in the lower power mode and information indicating the level of power at which the camera module that is to operate in the lower power mode is to be set. The first power, the second power, and the third power provided to the camera modules 2100a, 2100b, and 2100c, respectively, may have the same level or different levels. Also, the level of the first power, the second power, and the third power provided to the camera modules 2100a, 2100b, and 2100c, respectively, may be dynamically controllable.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

Embodiments of inventive concepts have been described above with reference to the accompanying drawings, but inventive concepts are not limited thereto and may be implemented in various different forms. It will be understood that inventive concepts can be implemented in other specific forms without changing the technical spirit or gist of inventive concepts. Therefore, it should be understood that the embodiments set forth herein are illustrative in all respects and not limiting.

What is claimed is:

1. An image sensor comprising:
   first and second chips; and
   a contact plug connecting the first and second chips,
   wherein,
   the first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, and a first connecting structure in the first insulating layer and connected to the first transistor,
   the second chip includes a second insulating layer including a third surface contacting the first insulating layer and a fourth surface opposite to the third surface, a second semiconductor substrate on the fourth surface of the second insulating layer, a second transistor on the second semiconductor substrate, a second connecting structure in the second insulating layer and connected to the second transistor, the second connecting structure including first and second metal layers, the second chip further including a first contact connected to the first metal layer in the second insulating layer between the first and second metal layers, and a first variable resistance element on the first contact in the second insulating layer and between the first and second metal layers, and is connected to the second metal layer, the contact plug extends from the first surface of the first semiconductor substrate to connect the first and second connecting structures, a vertical thickness of the second metal layer is greater than a vertical thickness of the first metal layer, and the image sensor further includes a second contact connecting the second metal layer and a third metal layer, wherein the third metal layer has a vertical thickness greater than that of the first metal layer.

2. The image sensor of claim 1, wherein the first variable resistance element includes a magnetic tunnel junction (MTJ) element.

3. The image sensor of claim 1, wherein,
the second connecting structure further includes a fourth metal layer on a same level as the first metal layer and apart from the first metal layer, and
the second chip further includes a second contact connected to the fourth metal layer in the second insulating layer and between the second and fourth metal layers, and the second chip further includes a second variable resistance element on the second contact in the second insulating layer and between the second and fourth metal layers, the second variable resistance element connected to the second metal layer.

4. The image sensor of claim 3, wherein the second insulating layer includes
a first sub-insulating layer between the first and second contacts, and
a capping film along the first and second variable resistance elements.

5. The image sensor of claim 1, wherein
the second connecting structure further includes a fourth metal layer on the same level as the first metal layer and apart from the first metal layer, and a fifth metal layer on the same level as the second metal layer and apart from the second metal layer, and
a second contact directly connects the fourth metal layer to the fifth metal layers.

6. The image sensor of claim 1, wherein the first metal layer is further from the first semiconductor substrate than the second metal layer.

7. The image sensor of claim 1, wherein
the contact plug lands in a recessed part of the third metal layer.

8. The image sensor of claim 1, wherein the contact plug is outside a region where the photoelectric conversion layer, the color filter, the microlens, and the first transistor of the first chip are arranged.

9. An image sensor comprising:
first and second chips; and
a contact plug connecting the first and second chips, wherein,
the first chip includes a first semiconductor substrate including first and second surfaces that are opposite to each other, a photoelectric conversion layer in the first semiconductor substrate, a color filter on the first surface of the first semiconductor substrate, a microlens covering the color filter, a first transistor on the second surface of the first semiconductor substrate and adjacent to the photoelectric conversion layer, a first insulating layer on the second surface of the first semiconductor substrate, and a first connecting structure in the first insulating layer and connected to the first transistor, the second chip includes a second insulating layer including a third surface contacting the first insulating layer and a fourth surface opposite to the third surface, a second semiconductor substrate on the fourth surface of the second insulating layer, a second transistor on the second semiconductor substrate, a second connecting structure in the second insulating layer and connected to the second transistor, the second connecting structure including first and second metal layers, the second chip further including a first contact connected to the first metal layer in the second insulating layer between the first and second metal layers, and a first variable resistance element on the first contact in the second insulating layer and between the first and second metal layers, and is connected to the second metal layer, the contact plug extends from the first surface of the first semiconductor substrate to connect the first and second connecting structures, wherein the second insulating layer includes a first sub-insulating layer between the first and second metal layers along the first metal layer and surrounding the first contact, and the first sub-insulating layer is recessed.

10. The image sensor of claim 9, wherein the second insulating layer further includes a capping film along a top surface of the first sub-insulating layer and along the first variable resistance element and surrounding the first variable resistance element.

11. The image sensor of claim 10, wherein the second insulating layer further includes a second sub-insulating layer filing a gap between the capping film and the second metal layer.

12. The image sensor of claim 9, wherein the first variable resistance element includes a magnetic tunnel junction (MTJ) element.

13. The image sensor of claim 9, wherein,
the second connecting structure further includes a third metal layer on a same level as the first metal layer and apart from the first metal layer, and
the second chip further includes a second contact connected to the third metal layer in the second insulating layer and between the second and third metal layers, and the second chip further includes a second variable resistance element on the second contact in the second insulating layer and between the second and third metal layers, the second variable resistance element connected to the second metal layer.

14. The image sensor of claim 13, wherein the second insulating layer includes
a first sub-insulating layer between the first and second contacts, and
a capping film along the first and second variable resistance elements.

15. The image sensor of claim 9, wherein
the second connecting structure further includes a third metal layer on the same level as the first metal layer and apart from the first metal layer, and a fourth metal layer on the same level as the second metal layer and apart from the second metal layer, and
the second contact directly connects the third metal layer to the and fourth metal layers.

16. The image sensor of claim 9, wherein a thickness of the second metal layer is greater than a thickness of the first metal layer.

\* \* \* \* \*